United States Patent
Yoshikawa et al.

(10) Patent No.: US 7,315,641 B1
(45) Date of Patent: Jan. 1, 2008

(54) PATTERN CORRECTING METHOD OF MASK FOR MANUFACTURING A SEMICONDUCTOR DEVICE AND RECORDING MEDIUM HAVING RECORDED ITS PATTERN CORRECTING METHOD

(75) Inventors: Kei Yoshikawa, Yokohama (JP); Satoshi Usui, Yokohama (JP); Koji Hashimoto, Yokohama (JP)

(73) Assignee: Kabushiki Kaisha Toshiba, Kawasaki-shi (JP)

( * ) Notice: Subject to any disclaimer, the term of this patent is extended or adjusted under 35 U.S.C. 154(b) by 1137 days.

(21) Appl. No.: 09/662,219

(22) Filed: Sep. 14, 2000

(30) Foreign Application Priority Data

Sep. 14, 1999 (JP) .................. 11-260270

(51) Int. Cl.
*G06K 9/00* (2006.01)
(52) U.S. Cl. .............. 382/144; 382/145; 382/147
(58) Field of Classification Search .......... 382/144, 382/145, 147; 438/16, 401, 462, 800; 716/2, 716/19, 20, 21; 356/237.4, 237.5, 394; 430/4, 430/5, 30; 700/96, 97, 105, 120–121; 378/34, 378/35

See application file for complete search history.

(56) References Cited

U.S. PATENT DOCUMENTS

| 5,879,844 A | 3/1999 | Yamamoto et al. |
| 6,060,368 A * | 5/2000 | Hashimoto et al. .......... 438/401 |

FOREIGN PATENT DOCUMENTS

| JP | 9-292701 | 11/1997 |
| JP | 9-319067 | 12/1997 |
| JP | 11-174658 | * 7/1999 |

* cited by examiner

*Primary Examiner*—Brian Le
(74) *Attorney, Agent, or Firm*—Finnegan, Henderson, Farabow, Garrett & Dunner, L.L.P.

(57) ABSTRACT

A pattern correcting method of a mask for manufacturing a semiconductor device includes extracting a correction portion to be corrected from a mask pattern on the mask, obtaining a surrounding environment of the correction portion and giving a correction amount to the correction portion. The correction amount is variable. The variable correction amount is given to the correction portion in accordance with the surrounding environment of the correction portion.

4 Claims, 30 Drawing Sheets

| SPACE | FRINGE |
|---|---|
| S<a | 0 |
| a≦S<b | +W |
| b≦S<c | +2W |
| S≧c | +3W |

| SPACE | FRINGE |
|---|---|
| S<a | 0 |
| a≦S<b | +W |
| b≦S<c | +2W |
| S≧c | +3W |

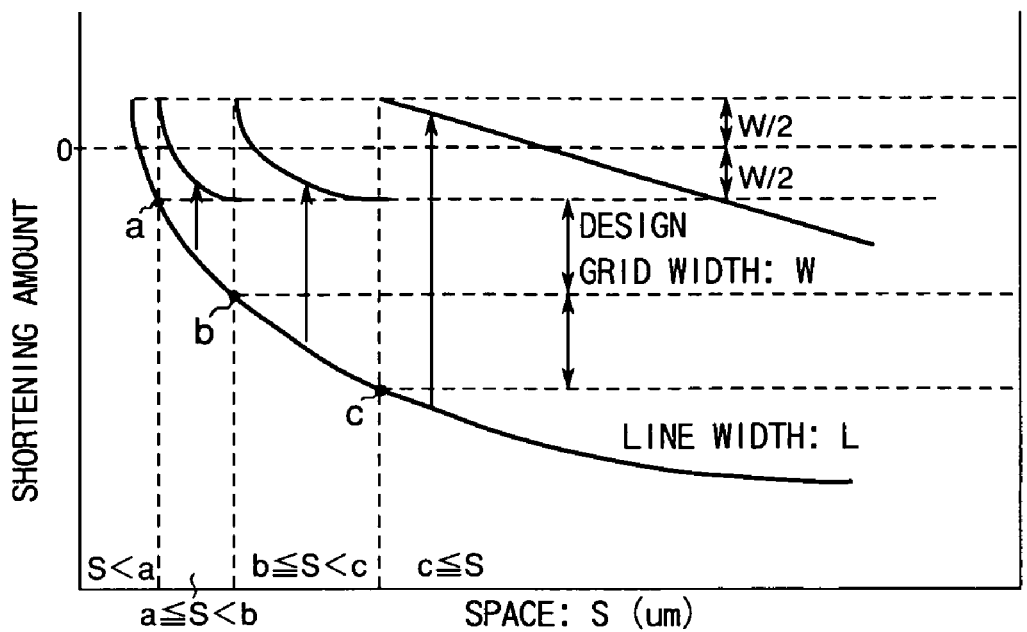
FIG. 7F
| SPEACE | FRINGE |
|---|---|
| S<a | 0 |
| a≦S<b | +W |
| b≦S<c | +2W |
| S≧c | +3W |
FIG. 7G
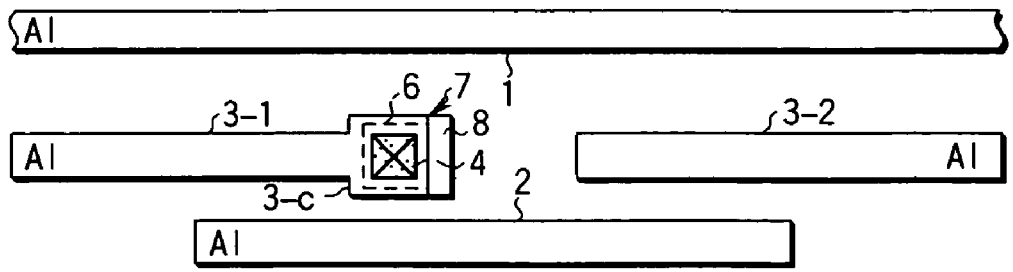
FIG. 7H

| AREA: A | FRINGE |
|---------|--------|
| A<a | +3W |
| a≦A<b | +2W |
| b≦A<c | +W |
| c≦A | 0 |

FIG. 9D

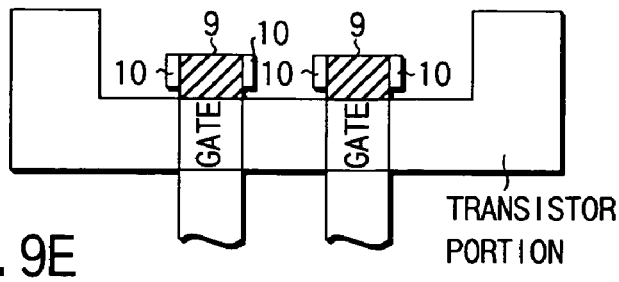

TRANSISTOR PORTION

FIG. 9E

CRRECTING FLOW

| A CORNER PORTION OF THE TRANSISTOR PORTION IS EXTRACTED | ~ST.1 |

| THE DISTANCE FROM THE ABOVE CORNER PORTION TO THE LINE PORTION IS MEASURED ON DESIGN (FIG. 11A) | ~ST.2 |

| THE MINIMUM DISTANCE WHERE THE LINE PORTION DOES NOT OVERLAP THE ROUNDING AMOUNT OF THE ABOVE CORNER PORTION IS OBTAINED (FIG. 11B) | ~ST.3 |

| A CORRECTION RULE IS MADE ACCORDING TO THE ABOVE CORRECTION RULE AND CORRECTION VALUES ARE EXTRACTED (FIG. 9D) | ~ST.4 |

| ACCORDING TO THE CORRECTION RULE. NOTCH PROCESSING OF THE CORNER PORTION OF THE TRANSISTOR PORTION IS EXECUTED (FIG. 11D, FIG. 11E, FIG. 11F) | ~ST.5 |

FIG. 10

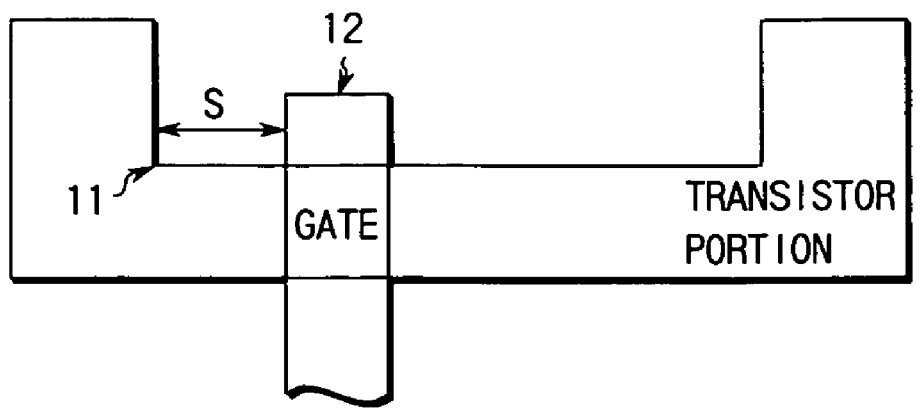
FIG. 11A
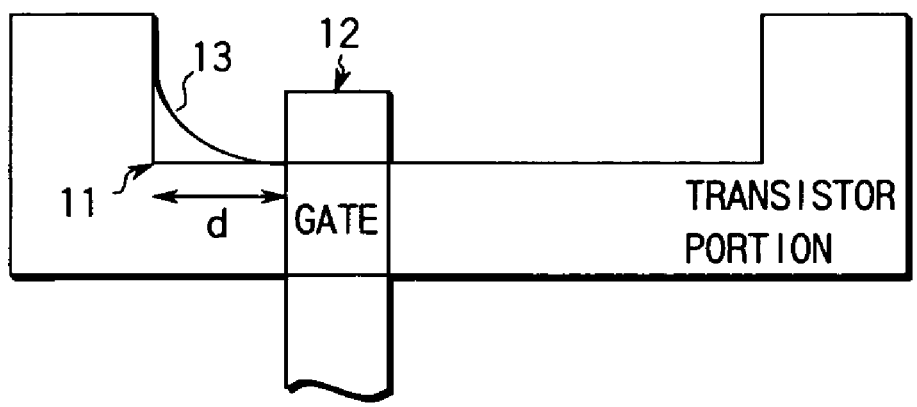
FIG. 11B
| DISTANCE: S | CORRECTION |
|---|---|
| S<d | NOTCH PROCESSING |
| S≧d | NO NOTCH PROCESSING |
FIG. 11C

CORRECTING FLOW

| A CONTACT PORTION BETWEEN THE CONTACT AND THE TRANSISTOR PORTIONS AND A CONTACT PORTION BETWEEN THE CONTACT AND THE GATE ARE EXTRACTED (FIG. 13A) | ~ ST. 1 |

↓

| THE DIAMETER: S1 AND S2 OF THE ABOVE CONTACT PORTION IS OBTAINED (FIG. 13A) | ~ ST. 2 |

↓

| A CORRECTION RULE ACCORDING TO THE ABOVE S1 AND S2 IS ESTABLISHED (FIG. 13B OR FIG. 13C) | ~ ST. 3 |

↓

| A CORRECTION RULE IS MADE ACCORDING TO THE CORRECTION RULE AND CORRECTION VALUES ARE EXTRACTED (FIG. 13D OR FIG. 13E) | ~ ST. 4 |

↓

| THE ABOVE CORRECTION VALUES ARE ADDED TO THE CONTACT (FIG. 13F) OR DELETED (FIG. 13G) | ~ ST. 5 |

FIG. 12

| DESIGN DIMENSION | BIAS AMOUNT TO BE ADDED TO S1 |
|---|---|
| S≦a | 0 |
| a<S≦b | +W |
| b<S≦c | +2W |
| S>c | +3W |
FIG. 13D
| DESIGN DIMENSION | BIAS AMOUNT TO BE SUBTRACTED FROM S2 |
|---|---|
| S≦a | 0 |
| a<S≦b | −W |
| b<S≦c | −2W |
| S>c | −3W |
FIG. 13E
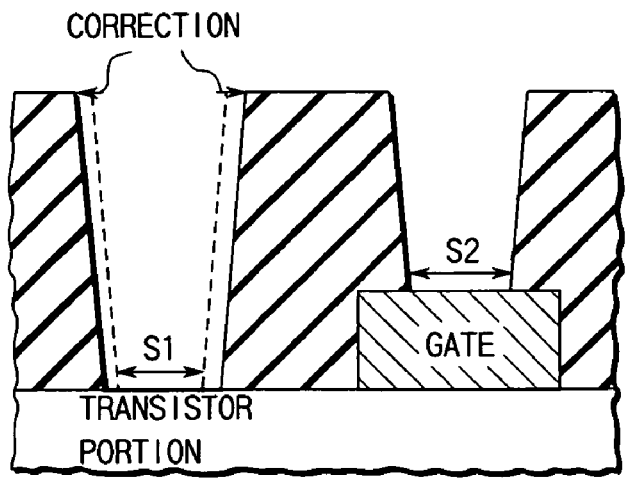
FIG. 13F
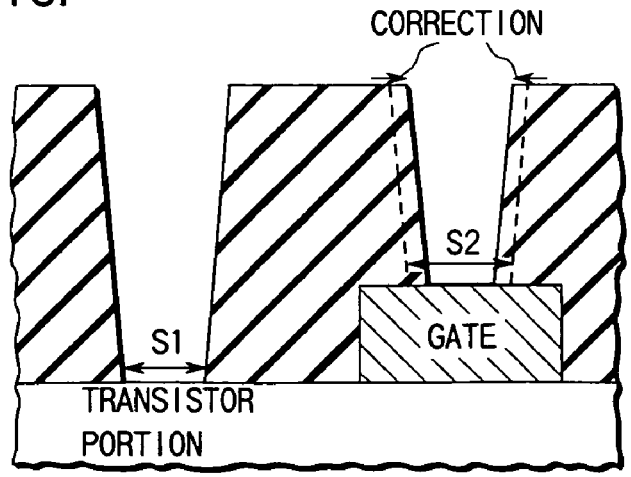
FIG. 13G

| SPACE | FRINGE |
|---|---|
| S≦a | 0 |
| a<S≦b | +W |
| b<S≦c | +2W |
| S>c | +3W |

| SPACE | FRINGE |
|---|---|
| S≦a' | 0 |
| a'<S≦b' | +W |
| b'<S≦c' | +2W |
| S>c' | +3W |

FIG. 15G

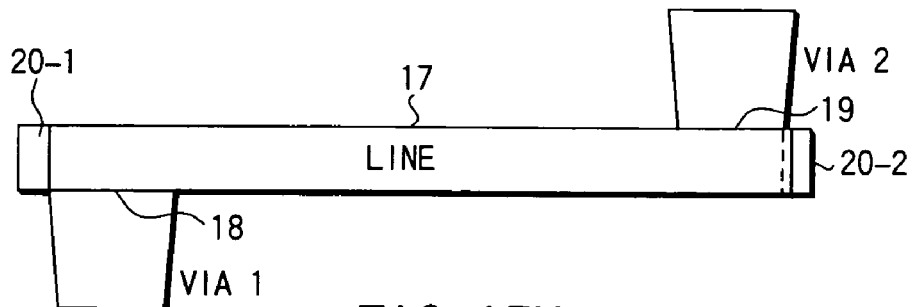

FIG. 15H

CORRECTING FLOW

| A CORRECTION RULE TABLE IS MADE FOR THE RESPECTIVE CORRECTION RULES ACCORDING TO THE FIRST TO FIFTH AND THE SEVENTH PREFERRED EMBODIMENTS | ST.1 |

↓

| CONSIDERING A MISALIGNMENT AMOUNT ACCORDING TO THE ABOVE CORRECTION RULE TABLE, A CORRECTION RULE TABLE SHOWN IN FIG.17A IS MADE FROM THE FIRST, SECOND, THIRD AND SEVENTH PREFERRED EMBODIMENTS, A CORRECTION RULE TABLE SHOWN IN FIG.17B FROM THE FOURTH PREFERRED EMBODIMENT, AND A CORRECTION RULE TABLE SHOWN IN FIG.17C FROM THE FIFTH PREFERRED EMBODIMENT | ST.2 |

↓

| CORRECTION PROCESSING IS CARRIED OUT FOR EACH OF THE ABOVE PREFERRED EMBODIMENT, CONSIDERING THE MISALIGNMENT AMOUNT | ST.3 |

FIG. 16

| SPACE | FRINGE |
|---|---|
| $S \leq a$ | $+C$ |
| $a < S \leq b$ | $+W+C$ |
| $b < S \leq c$ | $+2W+C$ |
| $S > c$ | $+3W+C$ |

FIG. 17A

| AREA | FRINGE |
|---|---|
| $S \leq a$ | $+3W+C$ |
| $a < S \leq b$ | $+2W+C$ |
| $b < S \leq c$ | $+W+C$ |
| $S > c$ | $+C$ |

FIG. 17B

| DISTANCE: S | CORRECTION |
|---|---|
| $S < a-C$ | NOTCH PROCESSING |
| $S \geq a-C$ | NO NOTCH PROCESSING |

FIG. 17C

| SPACE | CORRECTION |
|---|---|
| S≧a | 0 |
| b≦S<a | +W |
| c≦S<b | +2W |
| S<c | +3W |

PATTERN CORRECTING METHOD OF MASK FOR MANUFACTURING A SEMICONDUCTOR DEVICE AND RECORDING MEDIUM HAVING RECORDED ITS PATTERN CORRECTING METHOD

CROSS-REFERENCE TO RELATED APPLICATIONS

This application is based upon and claims the benefit of priority from the prior Japanese Patent Application No. 11-260270, filed Sep. 14, 1999, the entire contents of which are incorporated herein by reference.

BACKGROUND OF THE INVENTION

The present invention relates to a pattern correcting method of a mask for exposure used in a lithography process in manufacturing a semiconductor device, mask pattern correcting device and the mask for exposure and the semiconductor device using them.

Recently, with segmentation of a semiconductor device, problems have been arising that finished dimension is not exactly as designed in some portions. An example is shortening of a line end part. An example of the shortening is shown in FIG. 1.

Causes of the shortening can be as follows:

(1) Masks are not manufactured according to design dimension;

(2) Corner portions of a line end is already the light resolution limit; and (3) Mask conversion difference caused by etching.

Taking a wiring pattern of a borderless contact as an example, when a line end where contact portions overlap each other is shortened, an area of contact between the line and a contact hole is reduced, which causes rise in via resistance. This is one of the causes deteriorating device performance.

In order to avoid adverse effect by such shortening, methods such as designing with some additional fringe amount in advance for the contact portion or uniformly providing a fringe amount estimated by experiments using a correcting tool have been commonly used.

However, finishing error in shortening amount or the like can be varied depending on pattern density or line width.

In this way, in the conventional mask pattern correcting method, pattern dependency of the finishing error is not considered and sufficient correcting accuracy can not be obtained.

BRIEF SUMMARY OF THE INVENTION

A pattern correcting method of a mask for manufacturing a semiconductor device according to an aspect of the present invention comprises extracting a correction portion to be corrected from a mask pattern on the mask, obtaining a surrounding environment of the correction portion, and giving a variable correction amount to the correction portion in accordance with the surrounding environment.

A method is provided of pattern correcting a mask for manufacturing a semiconductor device. The method comprises extracting a correction portion to be corrected from a mask pattern on the mask, the correction portion being an overlapped portion where a line portion overlaps a contact portion. The method further comprises obtaining a surrounding environment of the correction portion, the surrounding environment of the correction portion being a space width between the line portion and another line portion. The method additionally comprises giving a variable correction amount to the correction portion in accordance with the surrounding environment, the variable correction amount being a line width given to the overlapped portion. The line width is increased by (i) an integer multiple of a design grid width in accordance with the space width and (ii) a misalignment amount.

In another aspect, a method is provided of pattern correcting a mask for manufacturing a semiconductor device. The method comprises extracting a correction portion to be corrected from a mask pattern on the mask, the correction portion being an overlapped portion where a line portion overlaps a contact portion. The method further comprises obtaining a surrounding environment of the correction portion, the surrounding environment of the correction portion being a space width between the line portion and another line portion. The method additionally comprises giving a variable correction amount to the correction portion in accordance with the surrounding environment, the variable correction amount being a line width given to the overlapped portion. The line width is increased by (i) an integer multiple of a design grid width in accordance with the space width, (ii) a misalignment amount, and (iii) half the design grid width.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 7F is a diagram showing a space width and a shortening amount.

FIG. 7G is a table showing a correction rule.

FIG. 7H is a plan view showing a pattern example used for the third preferred embodiment of the present invention.

FIG. 9D is a table showing a correction rule.

FIG. 9E is a plan view showing a pattern example used for the fourth preferred embodiment of the present invention.

FIG. 10 is a flowchart showing a mask pattern correcting method according to a fifth preferred embodiment of the present invention.

FIG. 11A is a plan view showing a pattern example used for the fifth preferred embodiment of the present invention.

FIG. 11B is a plan view showing a pattern example used for the fifth preferred embodiment of the present invention.

FIG. 11C is a table showing a correction rule.

FIG. 12 is a flowchart showing a mask pattern correcting method according to a sixth preferred embodiment of the present invention.

FIG. 13D is a table showing a correction rule.

FIG. 13E is a table showing a correction rule.

FIG. 13F is a sectional view showing a pattern example used for the sixth preferred embodiment of the present invention.

FIG. 13G is a sectional view showing a pattern example used for the sixth preferred embodiment of the present invention.

FIG. 15G is a table showing a correction rule.

FIG. 15H is a sectional view showing a pattern example used for the seventh preferred embodiment of the present invention.

FIG. 16 is a flowchart showing a mask pattern correcting method according to a eighth preferred embodiment of the present invention.

FIG. 17A is a table showing a correction rule.

FIG. 17B is a table showing a correction rule.

FIG. 17C is a table showing a correction rule.

DETAILED DESCRIPTION OF THE INVENTION

Figure 1:
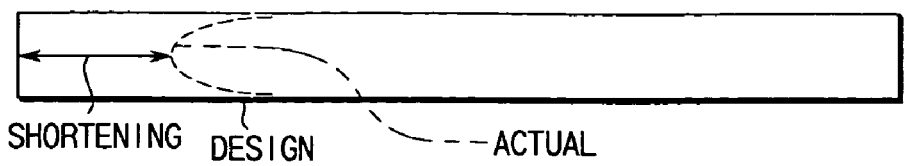
FIG. 1 is a diagram for explaining shortening.

Preferred embodiments of the present invention will be described below referring to the drawings. In the description, common parts shall bear common reference numbers through the drawings.

First Preferred Embodiment

First, a mask pattern correcting method according to a first preferred embodiment of the present invention will be explained.

The first preferred embodiment shows fringe processing of correcting and changing a pattern in a portion overlapping a contact portion in a wiring pattern having a borderless contact (line portion) by considering and correcting density of the pattern around the portion and the line width of the line portion.

Figure 2:
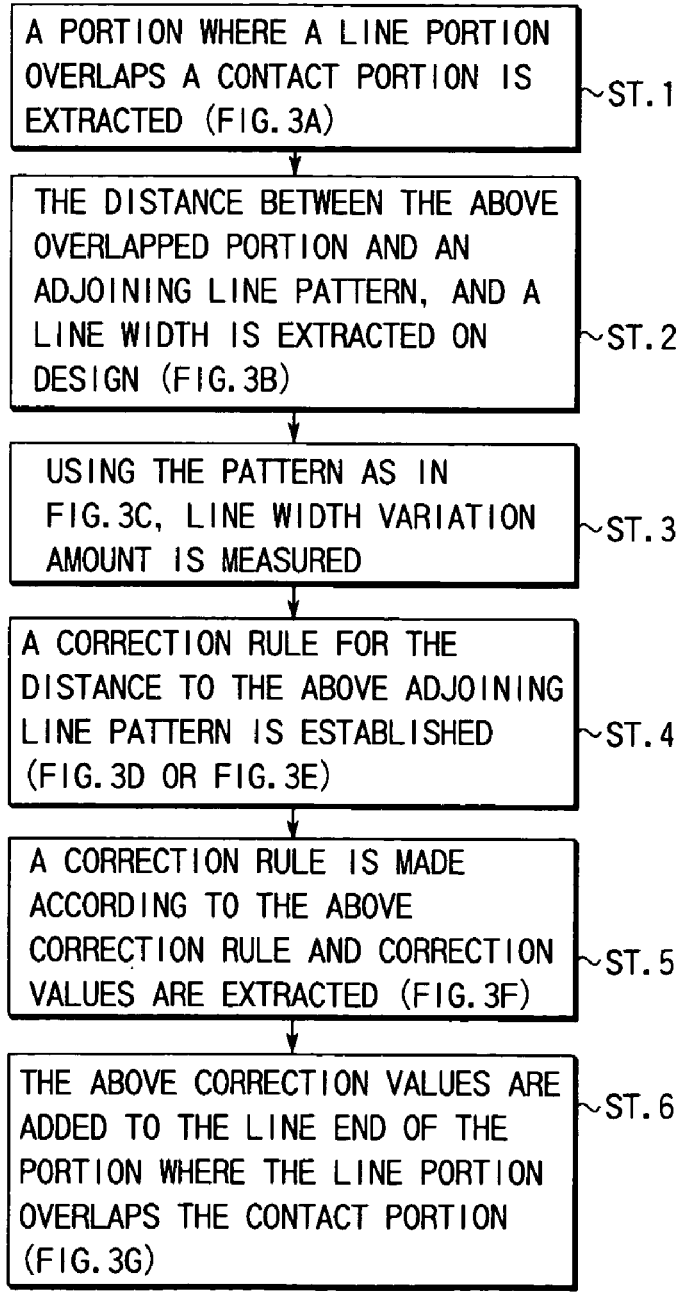
FIG. 2 is a flowchart showing a mask pattern correcting method according to a first preferred embodiment of the present invention.

FIG. 2 is a flowchart showing a mask pattern correcting method according to the first preferred embodiment, and FIGS. 3A to 3G are diagrams for explaining steps shown in FIG. 2.

At the Step ST.1 shown in FIG. 2, a portion where the line portion overlaps the contact portion is extracted.

Figure 3A:
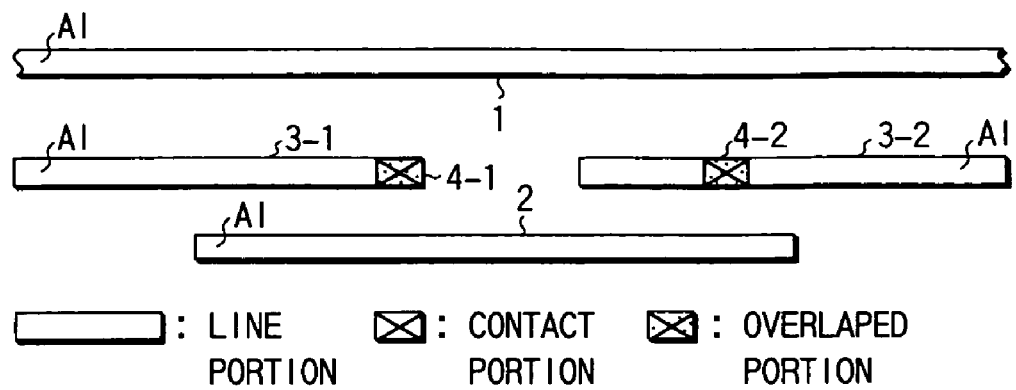
FIG. 3A is a plan view showing a pattern example used for the first preferred embodiment of the present invention.

FIG. 3A shows an example of a pattern having the line portion, contact portion and their overlapped portion used for the first preferred embodiment. The example shown in FIG. 3A is the one on design, for example, on CAD data. As shown in FIG. 3A, the pattern according to the example has line portions 1, 2, 3-1, and 3-2 in parallel with each other. The line portions 3-1 and 3-2 are arranged between the line portion 1 and the line portion 2, respectively. The contact portion 4-1 overlaps the end of the line portion 3-1. Also, the contact portion 4-2 overlaps the middle of the line portion 3-2 but not its end.

Then, at the Step ST.2, a space width between the above overlapped portion and the adjoining line portion is extracted on design, for example, on CAD data.

Figure 3B:
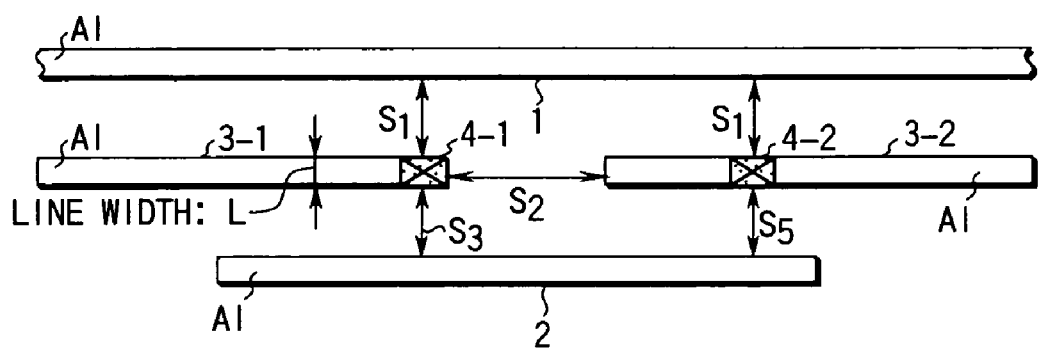
FIG. 3B is a plan view showing a pattern example used for the first preferred embodiment of the present invention.

Here, for the above space width, in the case of the contact portion 4-1 overlapping the end of the line portion as shown in FIG. 3B, the space width to the line portion opposed to each of the three sides of the overlapped portion is extracted. In the meantime, wen only the middle part of the line portion is overlapped as the contact portion 4-2, the space width to the line portion opposed to each of the two sides of the overlapped portion is extracted.

In the pattern according to the above example, a space width S1 from the contact portion 4-1 to the line portion 1, a space width S2 from the contact portion 4-1 to the line portion 3-2 and a space width S3 from the contact portion 4-1 to the line portion 2 were measured on design and extracted. And a space width S4 from the contact portion 4-2 to the line portion 1 and a space width S5 from the contact portion 4-2 to the line portion 3-2 are measured on design and extracted.

Moreover, at the Step ST.2, in addition to the space widths S1 through S5, the line width of the line portion is extracted.

In the pattern according to the above example, a line width L of the line portion 3-1 overlapping the contact portion 4-1 was measured on design and extracted. The line width L of the line portion 3-1 is equal to the line width of the line portion 3-2.

Figure 3C:
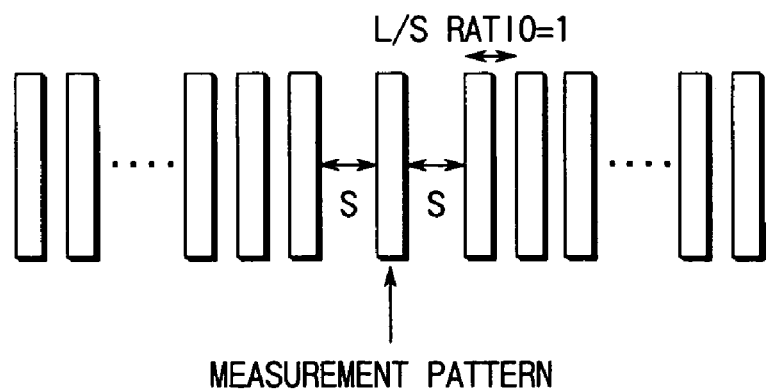
FIG. 3C is a plan view showing a measurement pattern example used for the first preferred embodiment of the present invention.

Next, at the Step ST.3, relationship between the space width and the line width variation amount is obtained experimentally or by simulation. When this relationship is obtained experimentally, a line width variation amount may be measured by creating a measurement pattern with the line and space (L/S) pattern as shown in FIG. 3C on a wafer and by using this with scanning electron microscope (SEM) or electric measurement. When obtained by simulation, a measurement pattern as shown in FIG. 3C is reproduced by a manufacturing process simulator, and its line width variation amount may be calculated. Examples of the obtained relationship between the space width and the line width variation amount are shown in FIGS. 3D and 3E.

Next, at the Step ST.4, using the obtained relationship between the space width and the line width variation amount, a correction rule for the space width to the adjoining line portion is established. The correction rule is set as follows, for example.

Figure 3D:
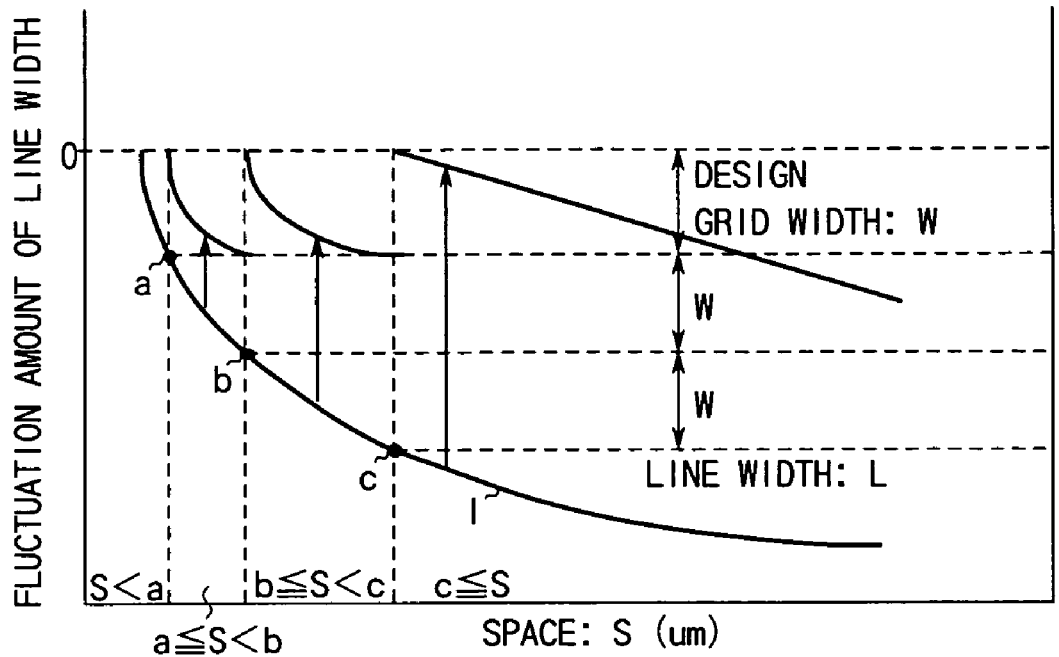
FIG. 3D is a diagram showing relationship between a space width and a line width variation amount.
Figure 3E:
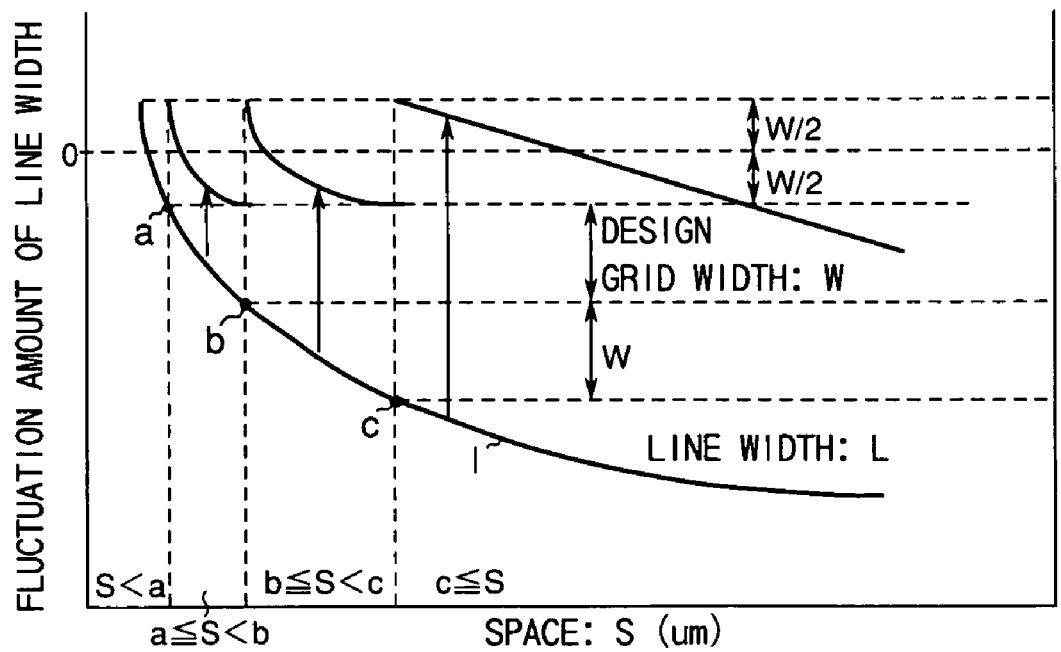
FIG. 3E is a diagram showing relationship between a space width and a line width variation amount.

As shown in FIGS. 3D and 3E, the line width variation amount is divided per design grid width W. The design grid width W is the minimum width that can be add at one time on CAD, for example. Then, intersections "a," "b," and "C" between the design grid width W and a variation curve I are extracted. Then, the space width S is divided per intersection parts, "S<a," "a≦S<b," "b≦S<c," and "c≦S."

In this example, as shown by the variation curve I, the larger becomes the space width S, the greater is dislocated the line width variation amount from "0" (line width design value). That is, the larger becomes the space width S", the thinner becomes the line width L Based on such trends, in the first preferred embodiment, a correction rule is set so that as the space width S gets larger compared to the above overlapped portion, the width of the above overlapped portion becomes larger. In this example, a correction value is set at "0" for the range of the space width S of "S<a," the correction value being set at "+W" for the range of "a≦S<b," the correction value being set at "+2W" for the range of "b≦S<c," and the correction value being set at "+3W" for the range of "c≦S."

Figures 3F, 3G:
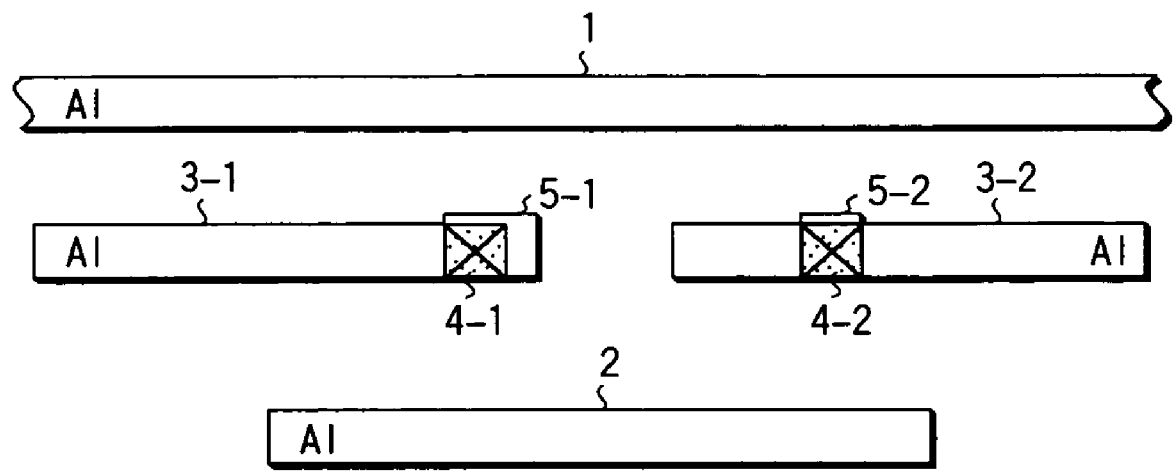
FIG. 3F is a table showing a correction rule.
FIG. 3G is a plan view showing a pattern example used for the first preferred embodiment of the present invention.

Then, at the Step ST.5, according to the above correction rule, a correction rule table as shown in FIG. 3F is made. After that, the space widths S1, S2, S3, S4, and S5 are checked with the established correction rule table and an appropriate correction value is extracted.

Then, at the Step ST.6, the extracted correction value is added to the line end of the portion where the line portion overlaps the contact portion as a fringe amount. Such fringe processing can be automatically executed by making a correction tool adapted to the present invention through programming, storing it in CAD, for example, and using it appropriately. A pattern according to the example of the state where the fringe processing is completed is shown in FIG. 3G. As shown in FIG. 3G, the above overlapped portion is provided respectively with fringes 5-1 and 5-2.

In this way, according to the first preferred embodiment, a correction value (fringe amount in this example) considering the surrounding environment such as pattern density, its line width, etc., is obtained for the portion where the line portion overlaps the contact portion, and the obtained correction values are compiled into a correction rule table. After that, fringe processing is executed automatically using the correction tool according to the correction rule table.

In a pattern made using a mask for manufacturing a semiconductor device to which such fringe processing is given, in comparison to the case where a mask is used to which a uniform fringe processing is given regardless of the surrounding environment, the above overlapped portion can be finished in the state closer to the design value or according to the design value.

As the above overlapped portion can be finished in the state closer to the design value, a problem such as a rise in contact resistance caused by reduction in a contact area or the like, for example, can be avoided. Thus, in a formed integrated circuit, a contact resistance closer to the design value can be obtained, and expected electric performance can be gained easily on circuits.

The difference between an example (FIG. 3D) and another example (FIG. 3E) of the correction rule is that the correction value is incremented by "W" with the line width variation amount "0" as reference or that the correction value is incremented by "W" with the value of the line width variation amount "0" plus ½ of the design grid width W as reference. In either example, a pattern formed on the wafer can be finished in the state close to the design value or according to the design value.

However, another example that the correction value is incremented by "+W" with the value plus ½ of the design grid width as reference shown in FIG. 3E is finished much closer to the design value or according to the design value.

That is because in one example shown in FIG. 3D, the variation of the line width L can be kept to the variation within the range from the line width variation amount "0" (that is, design value) to "−W," while another example shown in FIG. 3E can further keep the variation to the range from the line width variation amount "0" (that is, design value) to the range of "±W/2."

Also, as shown in FIG. 3G, in the pattern according to the above one example, correction is made so that the fringes 5-1 and 5-2 are added to the line portions 3-1 and 3-2 with the line width L but when there is a line width other than the line width L, a correction rule is established in the same way as above for each line width, and a correction rule table is made according to this correction rule. After that, correction can be made by adding fringes based on the established correction rule table.

Second Preferred Embodiment

Next, a mask pattern correcting method according to a second preferred embodiment of the present invention.

The second preferred embodiment is, as with the first preferred embodiment, fringe processing of correcting and changing the pattern in the portion overlapped with the contact portion, considering pattern density around the portion and the line width of the line portion in the wiring pattern having a borderless contact (line portion). The difference is that in the first preferred embodiment, the correction rule was established based on the relationship between the line width variation amount and the space width, while in the second preferred embodiment, the correction rule is made based on the relationship between the shortening amount and the space width in the line portion.

Figure 4:
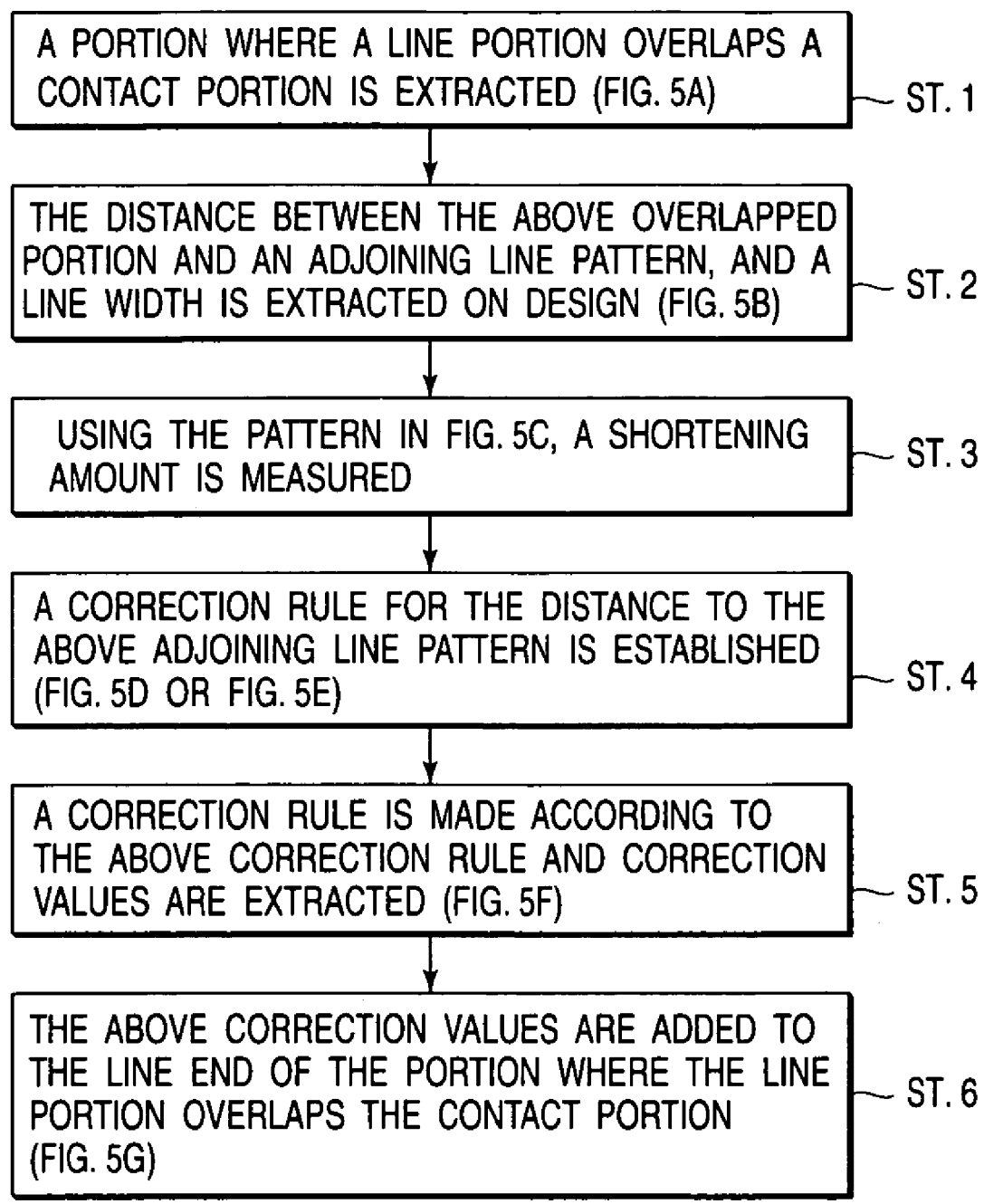
FIG. 4 is a flowchart showing a mask pattern correcting method according to a second preferred embodiment of the present invention.

FIG. 4 is a flowchart showing a mask pattern correcting method according to the second preferred embodiment, and FIGS. 5A to 5G are diagrams for explaining steps shown in FIG. 4.

Figure 5A:
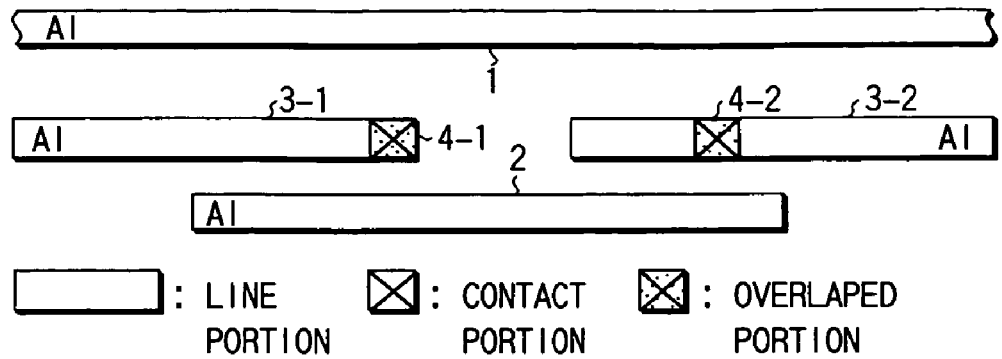
FIG. 5A is a plan view showing a pattern example used for the second preferred embodiment of the present invention.
Figure 5B:
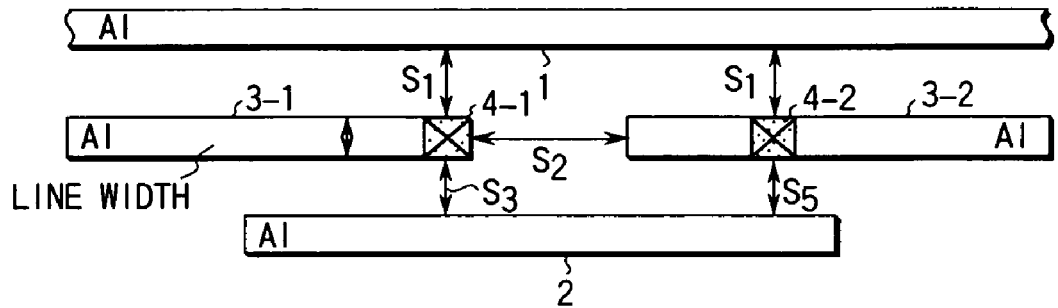
FIG. 5B is a plan view showing a pattern example used for the second preferred embodiment of the present invention.

At the Step ST.1 shown in FIG. 4, the portion where the line portion overlaps the contact portion is extracted. An example of the pattern used for the second preferred embodiment is shown in FIG. 5A. The example shown in FIG. 5A is on design, for example, on CAD design, which is a pattern similar to the example shown in FIG. 3A.

Then, at the Step ST.2, the space width (distance) between the above overlapped portion and the adjoining line portion is extracted on design, for example, on CAD data.

Here, for the above space width, as with the first preferred embodiment, the space width S1 from the contact portion 4-1 to the line part 1, the space width S2 from the contact portion 4-1 to the line portion 3-2, the space width S3 form the contact portion 4-1 to the line portion 2, the space width S4 from the contact portion 4-2 to the line portion 1, and the space width S5 from the contact portion 4-2 to the line portion 2 were measured and extracted on the design.

Moreover, at the Step ST.2, the line width of the line portion is extracted together with the space widths S1 to 55. Here, as with the first preferred embodiment, the line width L where the contact portion 4-1 overlaps the line portion 3-1 was measured on the design and extracted. The line width L of the line portion 3-1 and the line width of the line width 3-2 are supposed to be equal.

Figure 5C:
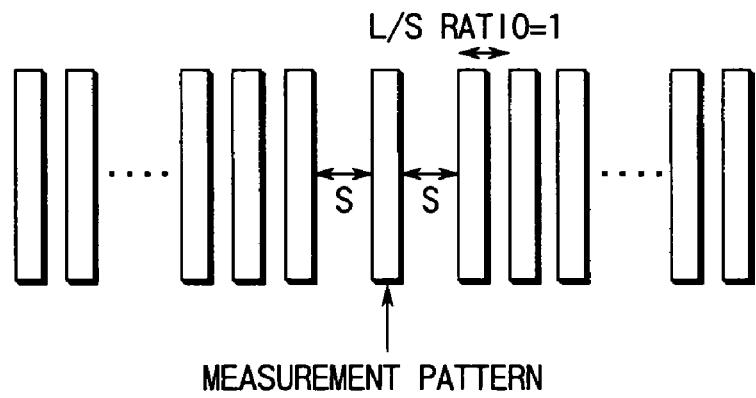
FIG. 5C is a plan view showing a measurement pattern example used for the second preferred embodiment of the present invention.

Then, at the Step ST.3, the relationship between the space width and the shortening amount of the line portion is obtained experimentally or by simulation. When this relationship is obtained experimentally, a measurement pattern with a pattern shown in FIG. 5C is formed on a wafer, and a shortening amount can be measured using a scanning electron microscope (SEM) or electric measurement. When obtained by simulation, a measurement pattern shown in FIG. 5C is reproduced on a manufacturing process simulator to calculate the shortening amount.

Then, at the Step ST.4, a correction rule is established for the space width to the adjoining line portion using the obtained space width and the shortening amount. The relationship between the space width and the shortening amount is shown in FIGS. 5D and 5E.

Figure 5D:
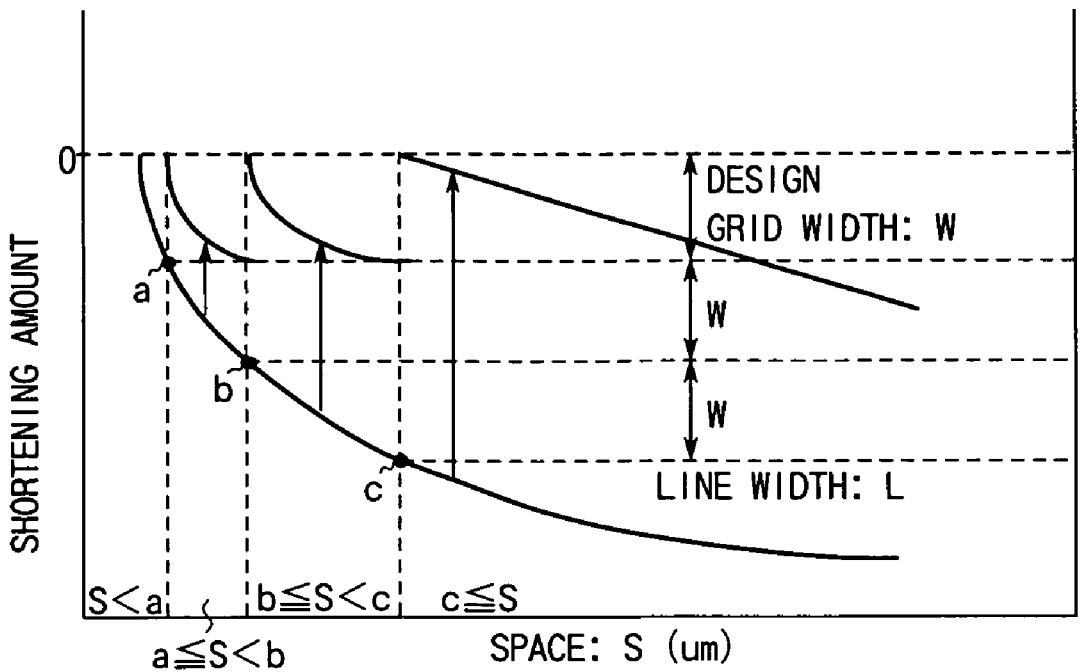
FIG. 5D is a diagram showing a space width and a shortening amount.
Figure 5E:
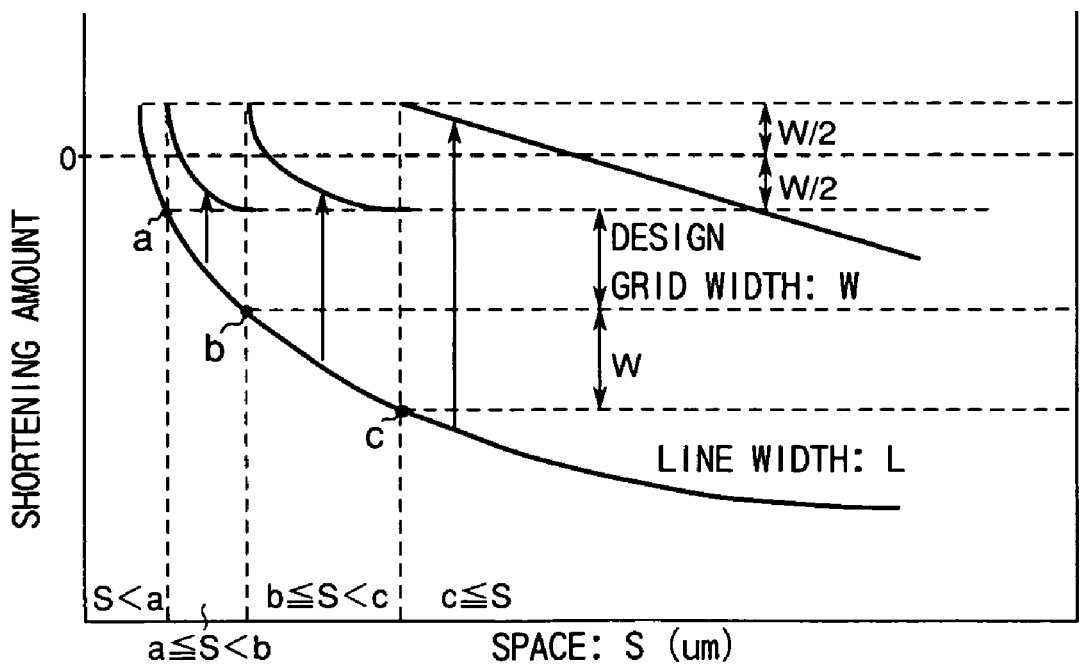
FIG. 5E is a diagram showing a space width and a shortening amount.

As shown in FIGS. 5D and 5E, the greater becomes the space width S, the larger is dislocated the shortening amount from "0", that is, the design value (variation curve I). That is, the greater becomes the space width S the thinner becomes the line width L. Based on such trends, in the second preferred embodiment, a correction rule to correct a pattern is established so that the width of the above overlapped portion gets larger as the space width S becomes larger compared to the above overlapped portion.

Figures 5F, 5G:
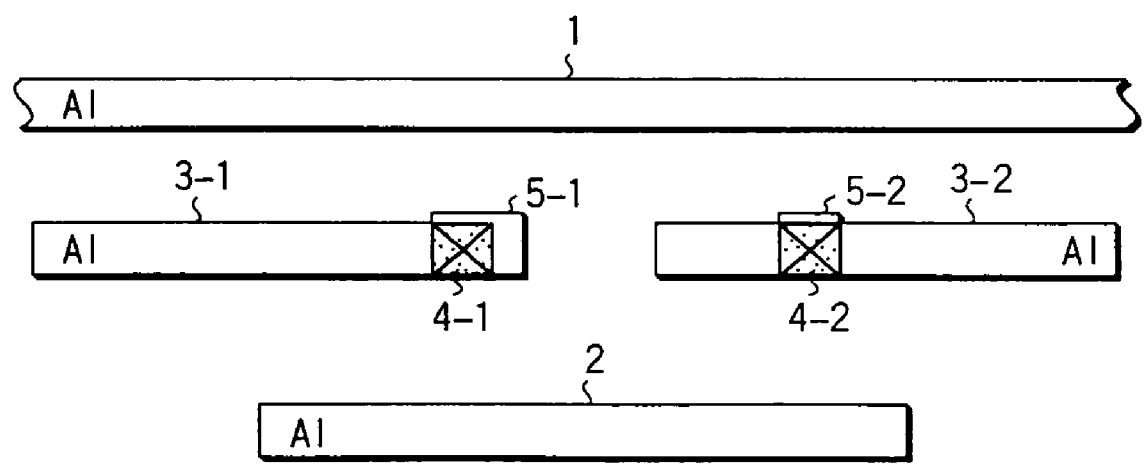
FIG. 5F is a table showing a correction rule.
FIG. 5G is a plan view showing a pattern example used for the second preferred embodiment of the present invention.

Then, at the Step ST.5, a correction rule table is made based on the above correction rule. To do this, as shown in FIGS. 5D and 5E, the vertical axis (shortening amount) is first divided per design grid width w (the design grid width w is, for example, the minimum width which can be added at one time on CAD). Next, an intersection between the design grid width W and the variation curve I is extracted. The intersections obtained through this work are "a," "b," and "c." Then, the correction value is set at "0" for the range of the space width S of "S<a," while the correction value of "+W" is provided for the range of the space width S of "a≦S<b." Moreover, the correction value of "+2W" is provided for the range of the space width S of "b≦S<c," and the correction value of "+3W"' for the range of the space width S of "c≦S." By this work, a correction rule table as shown in FIG. 5F is made.

Moreover, at the Step ST.5, correction values for the space widths S1, S2, S3, S4, and S5 obtained at the Step ST.2 are extracted from the correction rule table so made.

Then, at the Step ST.6, the extracted correction values are added as a fringe amount to the line end of the portion where the line portion overlaps the contact portion. This fringe processing can be automatically executed by making a correction tool adapted to the present invention through programming, storing it in CAD, for example, and using it appropriately. A pattern example of the state where the fringe processing is completed is shown in FIG. 5G. As shown in FIG. 5G, the above overlapped portion is provided respectively with fringes 5-1 and 5-2.

According to the second preferred embodiment, as with the first preferred embodiment, a correction fringe amount is obtained considering the surrounding environment such as pattern density, its line width, etc. for the portion where the line portion overlaps the contact portion, and the obtained correction fringe amounts are made into a correction rule table. After that, fringe processing is executed automatically using the correction tool according to the correction rule table.

In a pattern formed by a wafer process using a mask for manufacturing semiconductor to which such fringe processing is given, the above overlapped portion can be finished in the state closer to the design value or according to the design value in comparison to the case where a mask to which uniform fringe processing is given regardless of the surrounding environment.

In this way, as the above overlapped portion can be finished in the state closer to the design value, a problem such as a rise in contact resistance caused by reduction in a contact area or the like, for example, can be avoided. Thus, in a formed integrated circuit, a contact resistance closer to the design value can be obtained, and expected electric performance can be gained easily on circuits.

The difference between an example (FIG. 5D) and another example (FIG. 5E) of the correction rule is that the correction value is incremented by "W" with the shortening amount "0" as reference or that the correction value is incremented by "W" with the value of the shortening amount "0" plus ½ of the design grid width W as reference.

In either example, a pattern formed on the wafer can be finished in the state close to the design value or according to the design value.

However, another example that the correction value is incremented by "+W" with the value plus ½ of the design grid width as reference shown in FIG. 5E is finished much closer to the design value or according to the design value.

That is because in one example shown in FIG. 5D, the variation of the line width L can be kept to the variation within the range from the shortening amount "0" (that is, design value) to "−W", while another example shown in FIG. 5E can further keep the variation to the range from the line width variation amount "0" (that is, design value) to the range of "±W/2."

Also, as shown in FIG. 5G, in the pattern according to the above one example, correction is made so that the fringes 5-1 and 5-2 are added to the line portions 3-1 and 3-2 with the line width L but when there is a line width other than the line width L, a correction rule is established in the same way as above for each line width, and a correction rule table is made according to this correction rule. After that, correction can be made by adding fringes based on the established correction rule table.

In addition, both the first and the second preferred embodiments can be applied to one pattern example. In this case, the second preferred embodiment is applied to the line space S2 where the short sides of the line portion are opposed to each other, while the first preferred embodiment is applied to the space width S1, S3, S4 and S5 where the long sides of the line portion are opposed to each other.

The reason for this is that it is desirable to make correction based on the relationship between the space width and the shortening amount since shortening can easily occur for the space width where the short sides of the line portion are opposed to each other. Similarly, for the space width where the long sides of the line portion are opposed to each other, it is desirable to make correction based on the relationship between the space width and the line width variation since line width variation (thinning of wiring) can be easily occur.

Third Preferred Embodiment

Next, a mask pattern correcting method according to the third preferred embodiment of the present invention will be described. Unlike the first and the second preferred embodiments, this is fringe processing for correcting and changing the pattern of the contact portion and the overlapped portion, considering the pattern density of the surrounding area and the line width of the line portion in the wiring pattern (line portion) having a bordered contact.

Figure 6:
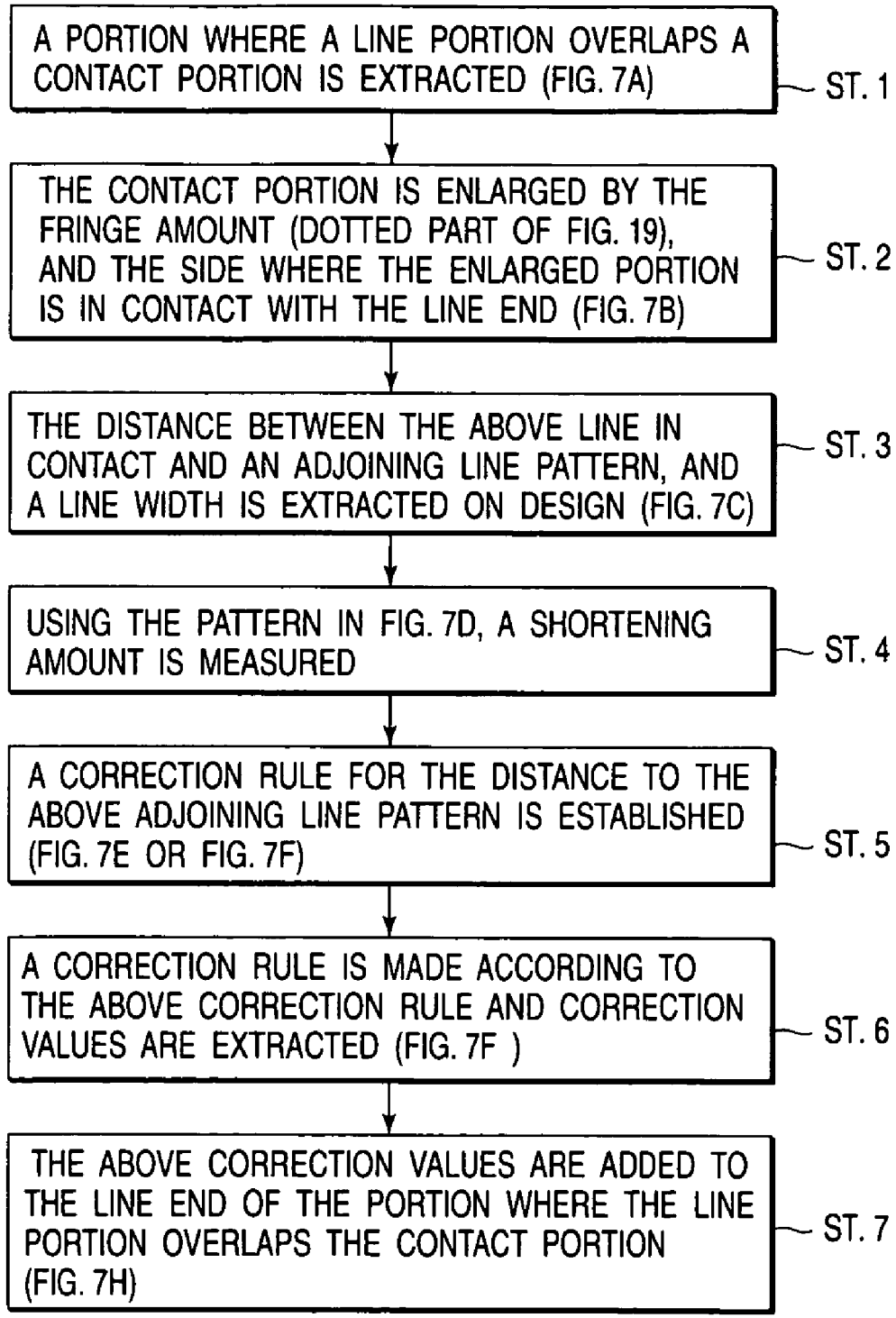
FIG. 6 is a flowchart showing a mask pattern correcting method according to a third preferred embodiment of the present invention.

FIG. 6 is a flowchart showing a mask pattern correcting method according to the third preferred embodiment, FIGS. 7A through 7H are diagrams for explaining steps shown in FIG. 6.

Figure 7A:
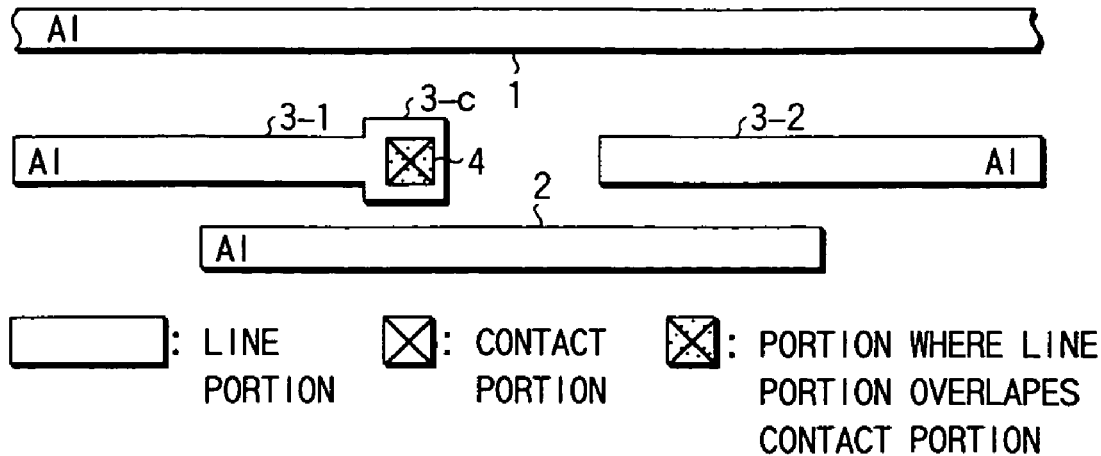
FIG. 7A is a plan view showing a pattern example used for the third preferred embodiment of the present invention.

First, at the Step ST.1, a portion where the line portion overlaps the contact portion is extracted. FIG. 7A shows an example of the pattern used for the third preferred embodiment. The example shown in FIG. 7A is on design, for example, on CAD data.

As shown in FIG. 7A, the pattern according to the example has line portions 1, 2, 3-1 and 3-2 in parallel with each other. The line portions 3-1 and 3-2 are arranged between the line portion 1 and the line potion 2, respectively. The contact portion 4 overlaps the contact portion 3-*c* provided at the end of the line portion 3-1.

Figure 7B:
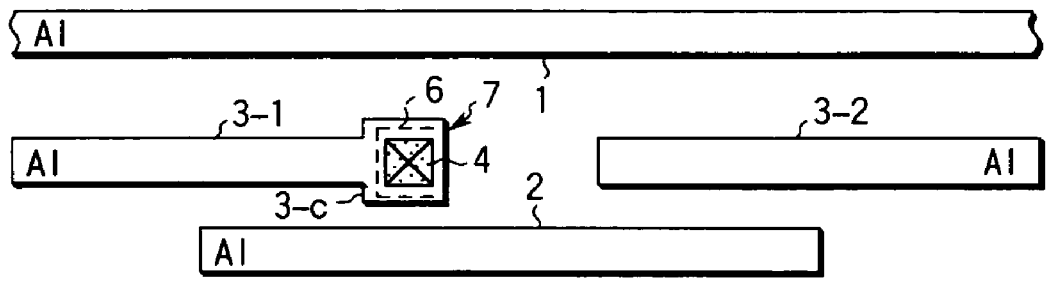
FIG. 7B is a plan view showing a pattern example used for the third preferred embodiment of the present invention.
Figure 7C:
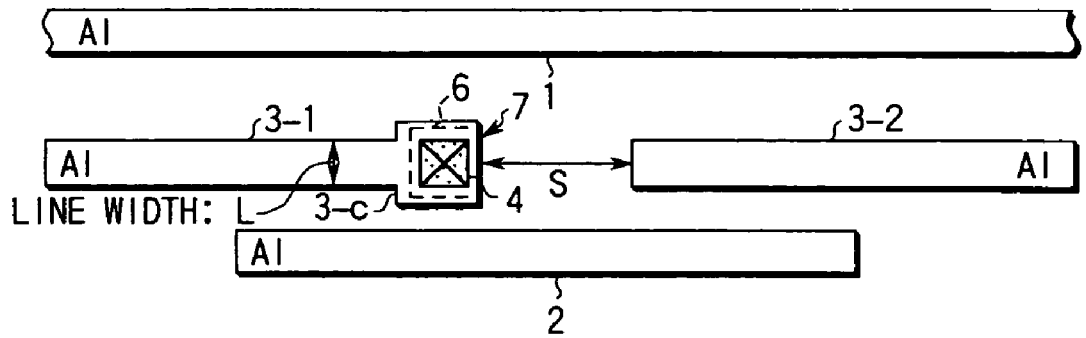
FIG. 7C is a plan view showing a pattern example used for the third preferred embodiment of the present invention.

Then, at the Step ST.2, as shown in FIG. 7B, the contact portion 4 is enlarged by the minimum design rule portion. A dotted line 6 shows the enlarged contact portion.

Moreover, at the Step ST.2, the side where the enlarged contact potion 6 is in contact with the line end of the line portion 3 is extracted.

In the pattern according to the above example, the above side in contact is a side 7 opposing the line portion 3-2 in the contact potion 3-*c*.

Then, at the Step ST.3, the space width (distance) between the above side 7 in contact and the adjoining line portion is extracted on design, for example, on CAD data.

Here, for the above space width, the space width S from the side 7 in contact to the line portion 3-2 was measured and extracted on the design.

In addition, at the Step ST. 3, the line width of the line portion as well as the space width S are extracted. Here, as with the first preferred embodiment, the line width L of the line portion 3-1 overlapping the contact portion 4 was measured on the design and extracted (The line width L of the line portion 3-1 and the line width of the line width 3-2 are supposed to be equal).

Figure 7D:
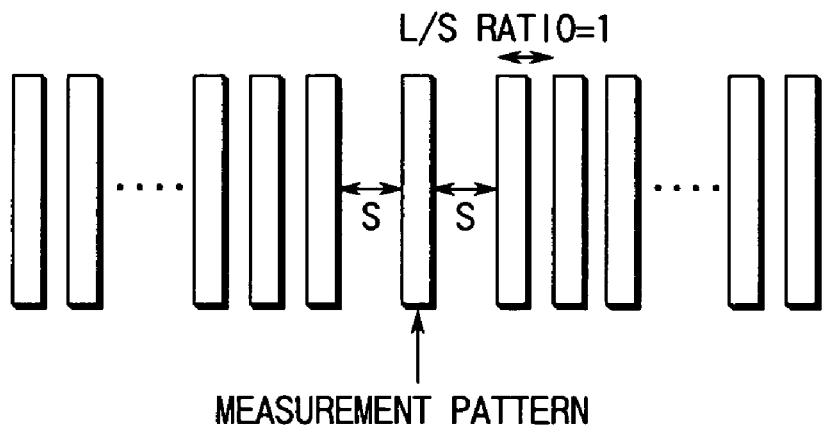
FIG. 7D is a plan view showing a measurement pattern example used for the third preferred embodiment of the present invention.

Then, at the Step ST.4, the relationship between the space width and the shortening amount of the line portion is obtained experimentally or by simulation. When this relationship is obtained experimentally, a measurement pattern with a pattern shown in FIG. 7D is formed on a wafer, and a shortening amount can be measured using a scanning electron microscope (SEM) or electric measurement. When obtained by simulation, a measurement pattern shown in FIG. 7D is reproduced on a manufacturing process simulator to calculate the shortening amount.

Then, at the Step ST.5, a correction rule is established for the space width to the adjoining line portion using the obtained relationship between the space width and the shortening amount. The relationship between the space width and the shortening amount is shown in FIGS. 7E and 7F.

Figure 7E:
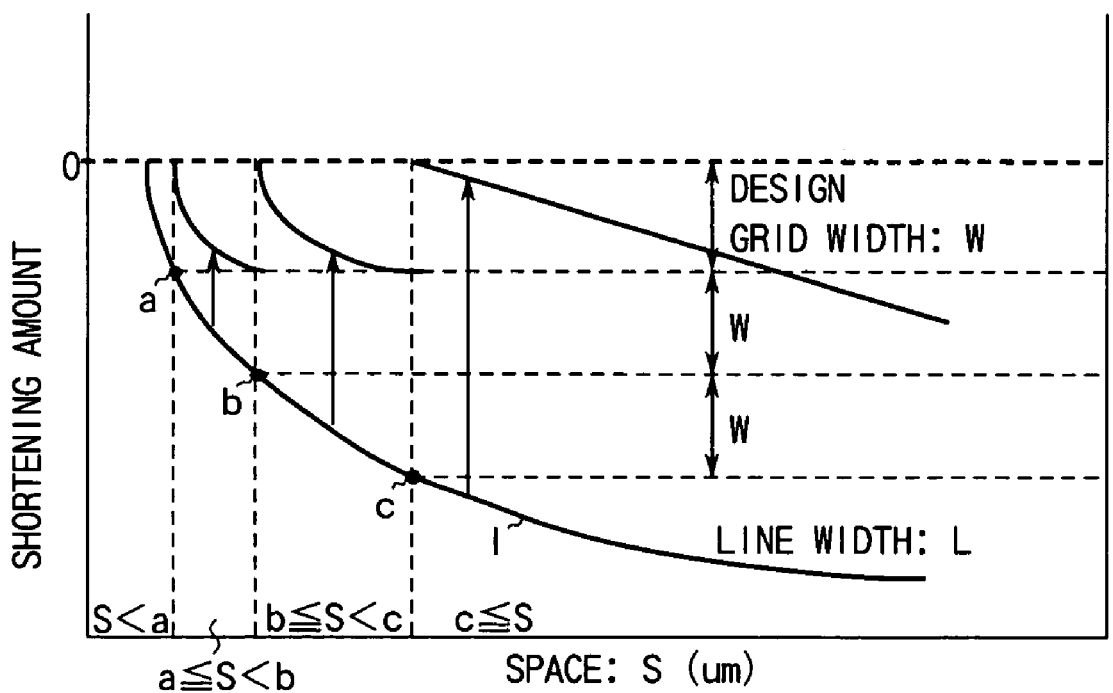
FIG. 7E is a diagram showing a space width and a shortening amount.

As shown in FIGS. 7E and 7F, in one pattern example, the greater becomes the space width S as shown by the variation curve I, the larger is dislocated the shortening amount from "0", that is, the design value. That is, the greater becomes the space width S, the thinner becomes the line width L. Based on such trends, in the third preferred embodiment, a correction rule is established so that the width of the above contact portion 3-*c* gets larger as the space width S becomes larger compared to the above side 7 in contact.

Then, at the Step ST.6, a correction rule table is made based on the above correction rule. To do this, as shown in FIGS. 7E and 7F, the vertical axis (shortening amount) is first divided per design grid width w (the design grid width w is, for example, the minimum width which can be added at one time on CAD). Next, an intersection between the design grid width w and the variation curve I is extracted. The intersections obtained through this work are "a," "b," and "c." Then, the correction value is set at "0" for the range of the space width S of "S<a," while the correction value of "+W" is provided for the range of the space width S of "a≦S<b." Moreover, the correction value of "+2W" is provided for the range of the space width S of "b≦b<S<c," and the correction value of "+3W" for the range of the space width S of "c≦S." By this work, a correction rule table as shown in FIG. 7G is made.

Moreover, at the Step ST.6, correction values for the space width S obtained at the Step ST.3 are extracted from the correction rule table so made.

Then, at the Step ST.7, the extracted correction values are added as a fringe amount to the above side 7 in contact. This fringe processing can be automatically executed by making a correction tool adapted to the present invention through programming, storing it in CAD, for example, and using it appropriately. A pattern example of the state where the fringe processing is completed is shown in FIG. 7H. As shown in FIG. 7H, the above side 7 in contact is provided with a fringe 8.

According to the third preferred embodiment, as with the first and the second preferred embodiments, a correction fringe amount is obtained considering the surrounding environment such as pattern density, its line width, etc. for the side 7 in contact where the contact portion 3-c is in contact with the enlarged contact portion 6, and a correction rule table is made. After that, fringe processing is executed automatically using the correction tool according to the correction rule table.

In a pattern formed by a wafer process using a mask for manufacturing semiconductor to which such fringe processing is given, the above overlapped portion can be finished in the state closer to the design value or according to the design value in comparison to the case where a mask to which uniform fringe processing is given regardless of the surrounding environment.

In this way, as the above overlapped portion can be finished in the state closer to the design value, a problem such as a rise in contact resistance caused by reduction in a contact area or the like, for example, can be avoided. Thus, in a formed integrated circuit, a contact resistance closer to the design value can be obtained, and expected electric performance can be gained easily on circuits.

The difference between an example (FIG. 7E) and another example (FIG. 7F) of the correction rule is that the correction value is incremented by W with the shortening amount "0" as reference or that the correction value is incremented by "W" with the value of the shortening amount "0" plus ½ of the design grid width "W" as reference. In either example, a pattern formed on the wafer can be finished in the state close to the design value or according to the design value.

However, another example that the correction value is incremented by "+W" with the value plus ½ of the design grid width as reference shown in FIG. 7F is finished much closer to the design value or according to the design value.

That is because in the example shown in FIG. 7E, when "S<c", for example, the variation of the line width L can be kept to the variation within the range from the shortening amount "0" (that is, design value) to "−W," while another example shown in FIG. 7F can further keep the variation to the range from the line width variation amount "0" (that is, design value) to the range of "±W/2."

Also, as shown in FIG. 7H, in the pattern according to the above one example, correction was made by adding the fringe 8 to the line portion 3-1 with the line width L, but when there is a line width other than the line width L, a correction rule is established with the same method as above for each line width, and a correction rule table is made according to this correction rule. After that, correction of adding fringes may be made based on the established correction rule table.

Fourth Preferred Embodiment

Next, a mask pattern correcting method according to a fourth preferred embodiment of the present invention will be described. The fourth preferred embodiment is fringe processing correcting shortening, considering an area which is a gate end and not within a transistor portion in an end part of the line running on the transistor portion.

Figure 8:
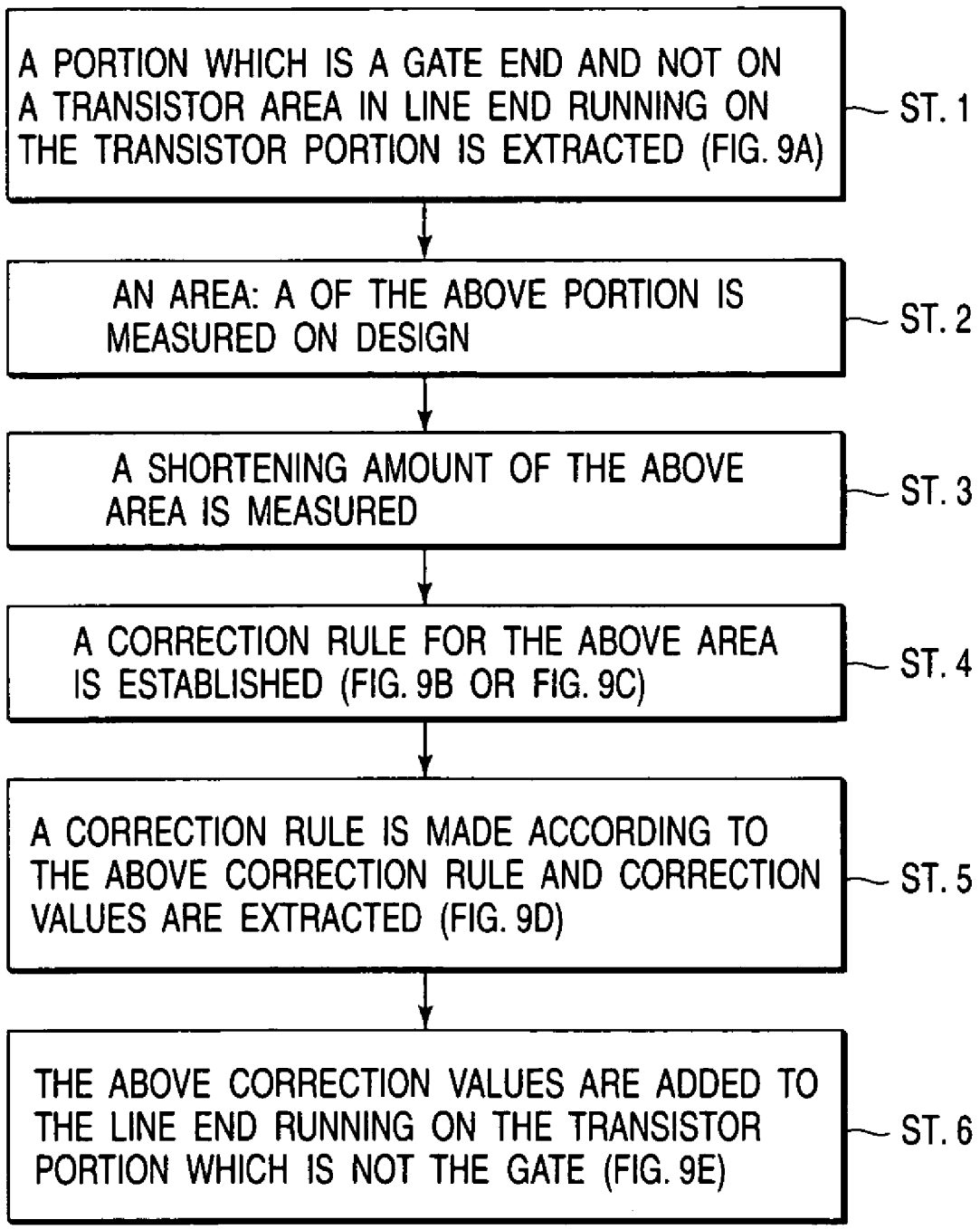
FIG. 8 is a plan view showing a mask pattern correcting method according to a fourth preferred embodiment of the present invention.

FIG. 8 is a flowchart sowing a mask pattern correcting method according to the fourth preferred embodiment, FIGS. 9A through 9E are diagrams for explaining steps shown in FIG. 8.

Figure 9A:
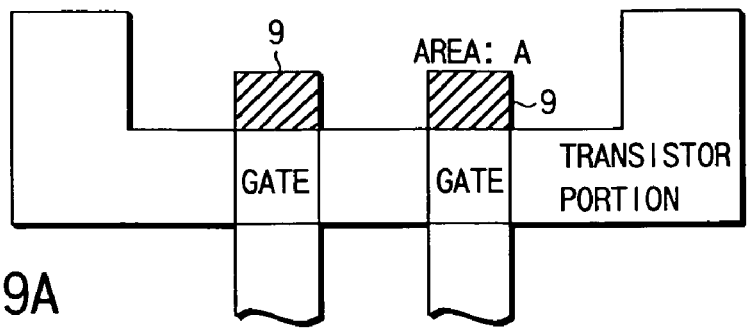
FIG. 9A is a plan view showing a pattern example used for the fourth preferred embodiment of the present invention.

First, at the Step ST.1, a portion that is a gate end and not on a transistor portion of the end part of the line running on the transistor portion is extracted. In FIG. 9A, one example of the pattern used for the fourth preferred embodiment is shown. This example is on design, for example, on CAD data, and a portion 9 shown by shading in FIG. 9A is the gate end and not on the transistor portion.

Then, at the Step ST.2, an area A of the above portion 9 is measured on design, for example, on CAD data.

Next, at the Step ST.3, a shortening amount of the line portion is obtained per area A experimentally or by simulation. This shortening amount can be measured using a scanning electron microscope (SEM) or electric measurement as with the first to the third preferred embodiments.

Then, at the Step ST.4, a correction rule for the above area A is established. The relationship between the area and the shortening amount is shown in FIGS. 9B and 9C.

Figure 9B:
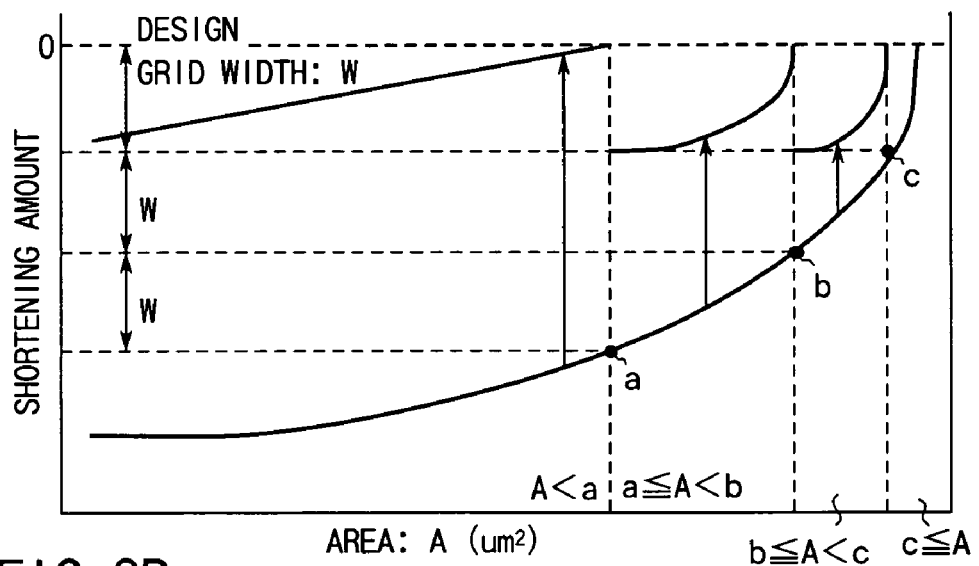
FIG. 9B is a diagram showing relationship between an area and a shortening amount.
Figure 9C:
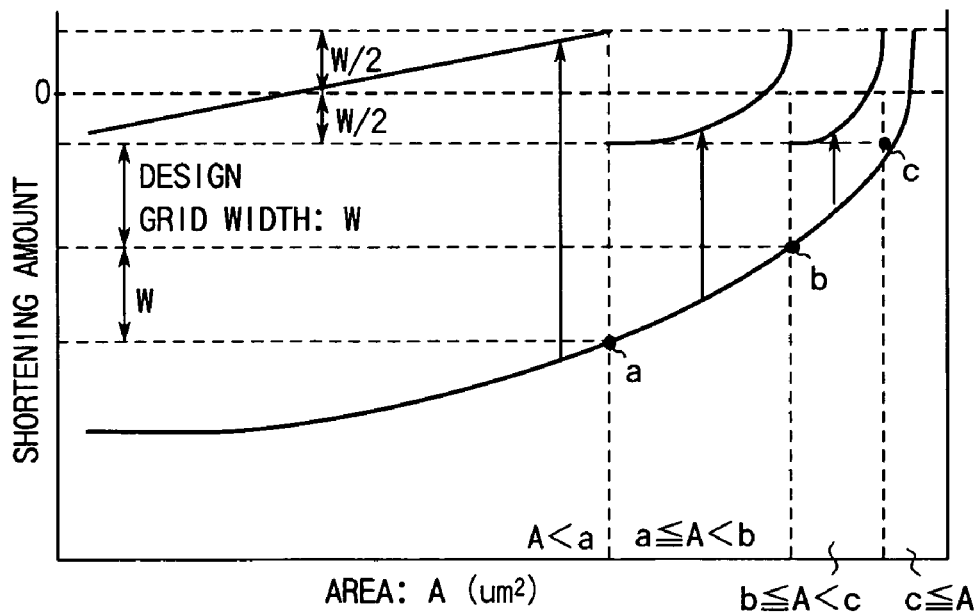
FIG. 9C is a diagram showing relationship between an area and a shortening amount.

As shown in FIGS. 9B and 9C, in one pattern example, the smaller is the area A as shown by the variation curve I, the larger is dislocated the shortening amount from "0", that is, the design value. That is, the smaller is the area A, the thinner becomes the line width L. Based on such trends, in the fourth preferred embodiment, a correction rule to correct a pattern is established so that the area of the above portion 9 gets larger as the area A becomes smaller compared to the above portion.

Then, at the Step ST.5, a correction rule table is made based on the above correction rule. To do this, as shown in FIGS. 9B and 9C, the vertical axis (shortening amount) is first divided per design grid width W (the design grid width W is, for example, the minimum width which can be added at one time on CAD). Next, an intersection between the design grid width W and the variation curve I is extracted. The intersections obtained through this work are "a," "b," and "c." Then, the correction value of "+3W" is provided for the range of the area A of "A<a," "+2W" for the range of "a≦A<b," and "+W" for the range of "b≦A<c." Also, the correction value is not provided for the range of the area A of "c≦A." By this work, a correction rule table as shown in FIG. 9D is made.

Moreover, at the Step ST. 5, correction values for the area A obtained at the Step ST.2 are extracted from the correction rule table so made.

Then, at the Step ST.6, the extracted correction values are added to the line end of the above portion 9 as a fringe amount. This fringe processing can be automatically executed by making a correction tool adapted to the present invention through programming, storing it in CAD, for example, and using it appropriately. A pattern example of the state where the fringe processing is completed is shown in FIG. 9E. As shown in FIG. 9E, the above portion 9 is provided with a fringe 10.

According to this fourth preferred embodiment, a correction amount is obtained for the area of the portion 9 which is a gate end and not on a transistor portion and made into a correction rule table. After that, fringe processing is executed automatically using the correction tool according to the correction rule table.

In a pattern made by the wafer process using a mask for manufacturing a semiconductor device on which such fringe processing is given, in comparison to the case where a mask is used to which a uniform fringe processing is given regardless of the surrounding environment, the above portion 9 can be finished in the state closer to the design value or according to the design value.

In this way, as the above portion 9 is finished in the state closer to the design value, a problem such as short-circuit between a source and a drain caused by shortening of a gate can be avoided.

Also, the difference between an example (FIG. 9B) and another example (FIG. 9C) of the correction rule is that the correction value is incremented by "W" with the shortening amount "0" as reference or that the correction value is incremented by "w" with the value of the shortening amount "0" plus ½ of the design grid width W as reference. In either example, a pattern formed on the wafer can be finished in the state close to the design value or according to the design value.

However, another example that the correction value is incremented by "+W" with the value plus ½ of the design grid width as reference shown in FIG. 9C is finished much closer to the design value or according to the design value. That is because in one example shown in FIG. 9B, when "S<c," the variation of the line width L can be kept to the variation within the range from the shortening amount "0", (that is, design value) to "−W," while another example shown in FIG. 9C can further keep the variation to the range from the line width variation amount "0" (that is, design value) to the range of "±W/2."

Fifth Preferred Embodiment

Next, a mask pattern correcting method according to a fifth preferred embodiment of the present invention will be described.

The fifth preferred embodiment is notch processing, considering the distance between a corner portion and a line portion adjoining this corner portion in the corner portion of a transistor portion. Here, the notch processing is defined as cutting of the corner portion of the transistor portion for proximity effect correction.

FIG. 10 is a flowchart sowing a mask pattern correcting method according to the fifth preferred embodiment, FIGS. 11A through 11F are diagrams for explaining steps shown in FIG. 10.

First, at the Step ST.1 shown in FIG. 10, a corner portion of a transistor portion is extracted. In FIG. 11A, one example of the pattern used for the fifth preferred embodiment is shown. This example is on design, for example, on CAD data, and the portion referred to by the reference number 11 in FIG. 9A is the corner portion and the portion referred to by the reference number 12 is the line portion.

Next, at the Step ST.2, the distance S from the corner portion 11 to the line portion 12 is measured on design, for example, on CAD data.

Then, at the Step ST.3, the minimum distance d that the line portion 12 does not overlap rounding of the corner portion 11 is obtained experimentally or by simulation.

Next at the Step ST.4, a correction rule is established for the above distance S. In FIG. 11B, the relationship between the rounding 13 of the corner portion 11 and the line potion 12 is shown. As shown in FIG. 11B, if the above distance S is above the minimum distance d (S≧d), the line portion 12 does not overlap the rounding of the corner portion 11, but if the above distance S is less than the minimum distance d (S<d), it overlaps the rounding. Based on such trends, in the fifth preferred embodiment, if "S<d," notch processing is given to the corner portion 11, while if "S≧d," notch processing is not given to the corner portion 11. Such a correction rule is made into a table in FIG. 11C.

Then, at the Step ST.6, the notch processing is given to the corner portion 11 when required according to the above correction rule. This notch processing can be automatically executed by making a correction tool adapted to the present invention through programming, storing it in CAD, for example, and using it appropriately.

Figure 11D:
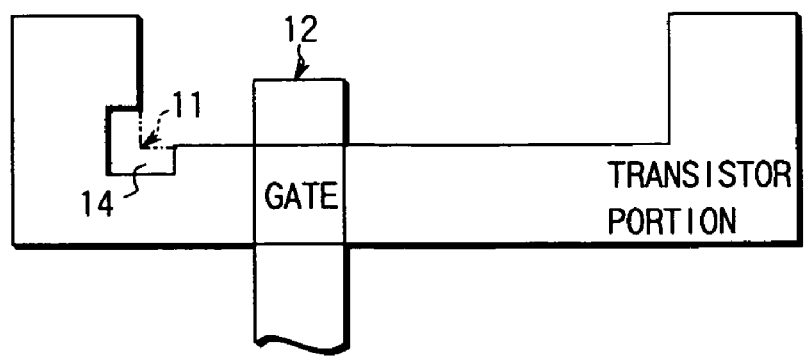
FIG. 11D is a plan view showing a notched portion.
Figure 11E:
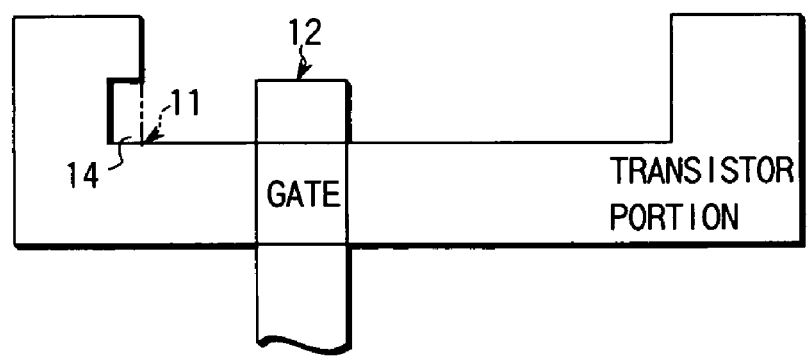
FIG. 11E is a plan view showing a notched portion.
Figure 11F:
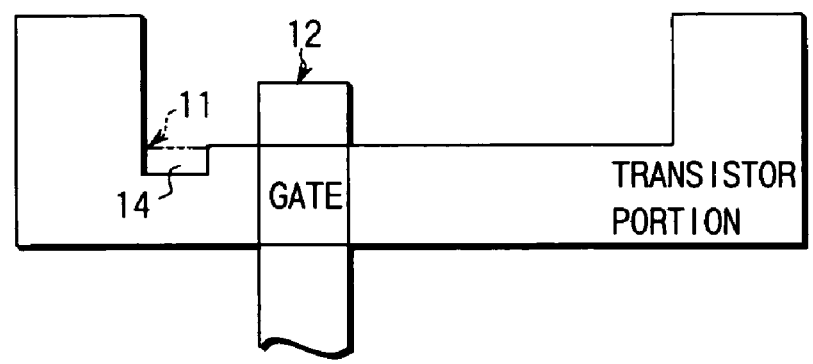
FIG. 11F is a plan view showing a notched portion.

The pattern examples to which notch processing is given are shown in FIGS. 11D, 11E and 11F. As shown in FIGS. 11D to 11F, the corner portion 11 is provided with a notch portion 14.

According to this fifth preferred embodiment, notch processing is given to the corner portion 11 of the transistor portion, considering the distance S between this corner portion 11 and the line portion 12.

In a pattern formed by a wafer process using a mask for manufacturing semiconductor to which such notch processing is given, the line portion 12 does not overlap the rounding of the corner portion 11. As a result, even if shortening occurs at the line portion 12, the transistor portion will not be exposed easily. Thus, a problem such as short-circuit between a source and a drain caused by shortening of the line portion 12 (gate) can be avoided.

Sixth Preferred Embodiment

Next, a mask pattern correcting method according to a sixth preferred embodiment of the present invention will be explained.

The sixth preferred embodiment is bias processing for a deep contact hole in contact with the transistor portion or a shallow contact hole in contact with the gate when the side wall of the contact hole is not vertical.

FIG. 12 is a flowchart showing a mask pattern correcting method according to the sixth preferred embodiment, FIGS. 13A to 13G are diagrams for explaining steps shown in FIG. 12.

Figure 13A:
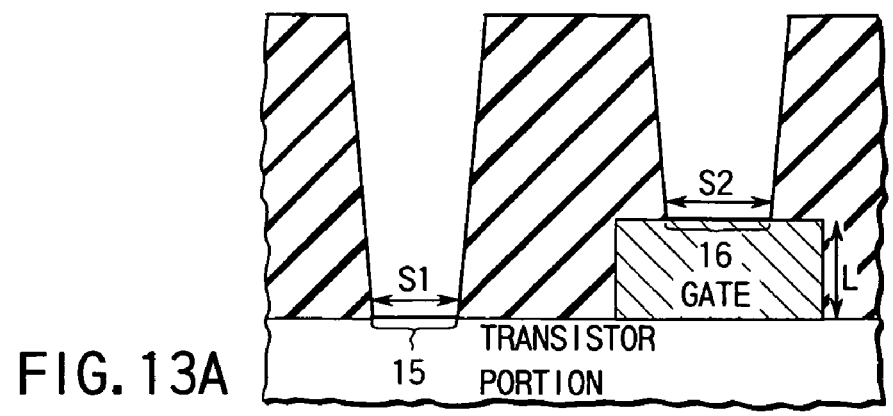
FIG. 13A is a sectional view showing a pattern example used for the sixth preferred embodiment of the present invention.

First, at the Step ST.1 shown in FIG. 12, a contact portion between the contact hole and the transistor portion and a contact portion between the contact hole and the gate are extracted. FIG. 13A shows an example of the pattern used for the sixth preferred embodiment (cross sectional example). In FIG. 13A, the portion referred to by the reference number 15 is the contact portion of the contact hole and the transistor portion and the portion referred to by the reference number 16 is the contact portion of the contact hole and the gate.

Then, at the Step ST.2, a diameter S1 of the contact portion 15 for the design dimension and a diameter S2 of the contact area 16 for the design dimension are obtained experimentally or by simulation. Here, the diameters S1 and S2 can be obtained by using methods such as scanning electron microscope (SEM) or electric measurement.

Next, at the Step ST.3, the difference between the diameter S1 and the diameter S2, "S1-S2" is obtained.

Figure 13B:
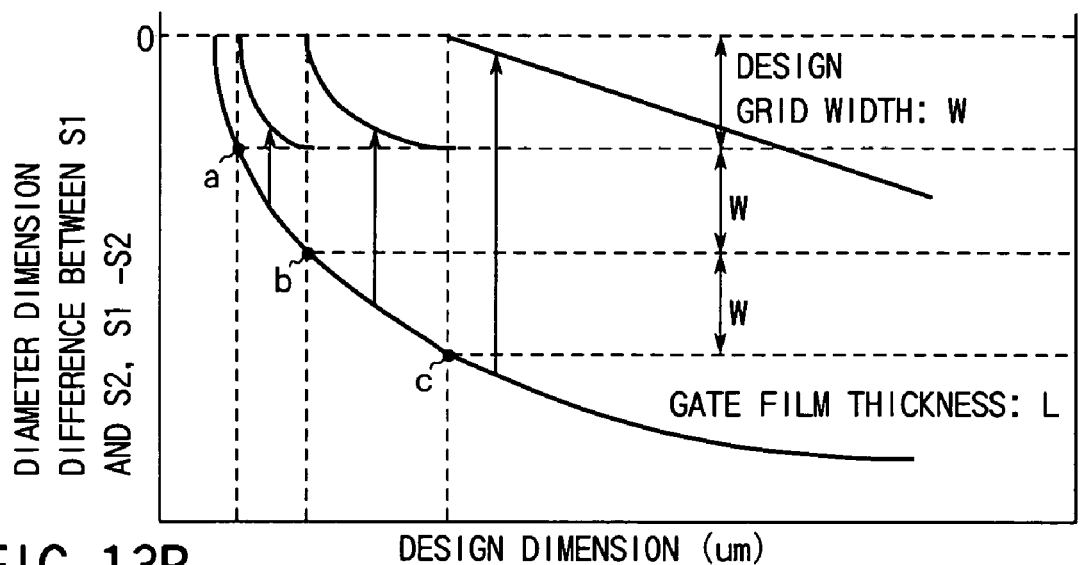
FIG. 13B is a diagram showing relationship between a design dimension and a diameter difference.
Figure 13C:
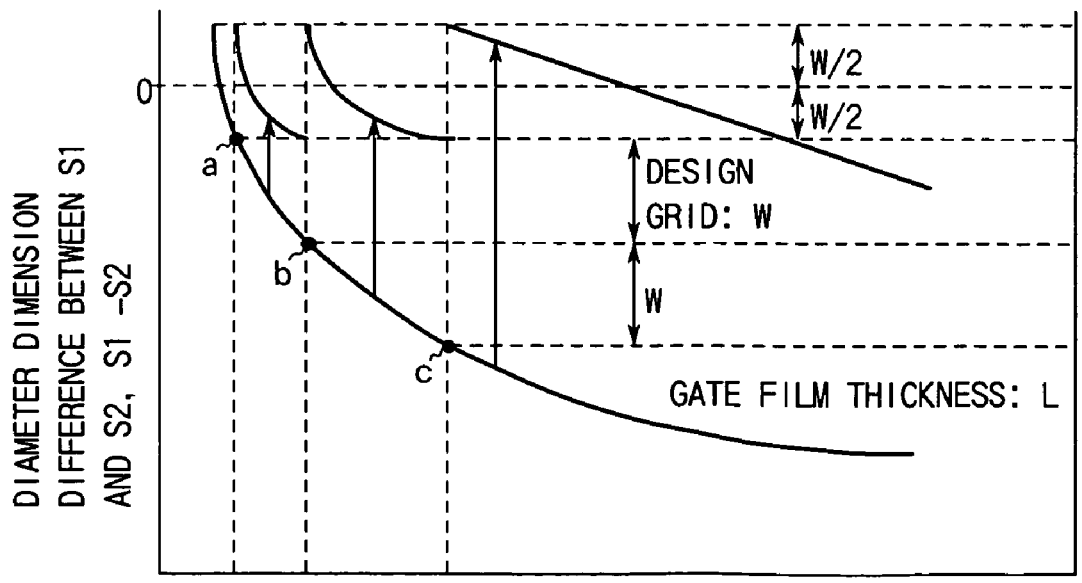
FIG. 13C is a diagram showing relationship between a design dimension and a diameter difference.

Then, at the Step ST.4, a vertical axis of the FIG. 13B or 13C (the difference between the diameter S1 and the diameter S2, "S1-S2") is divided per design grid width W with the point of "S1-S2=0" as reference (FIG. 13B) or the point of "S1-S2=0" plus ½ of the design grid width W as reference (FIG. 13C). Then, an intersection between the straight line showing the design grid width W and the S1-S2 curve is extracted. When the intersections extracted by the above work for a gate film thickness L are "a," "b," and "c," a bias amount to be added to the diameter S1 in the range of "design dimension <a" is "0," a bias amount of "+W" is added to the diameter S1 in the range of "a ≦ design dimension <b," a bias amount of "+W" is added to the diameter S1 in the range of "b ≦ design dimension <c," and a bias amount of "+2W" is added to the diameter S1 in the range of "c ≦ design dimension." By this work, a correction rule table as shown in FIG. 13D is made for a gate film thickness L. by correcting the diameter S1 according to the correction rule table shown in FIG. 13D, the diameter S1 gets closer to the diameter S2.

Also, contrary to the above work, the diameter S2 can be made closer to the diameter S1 by subtracting a bias amount from the diameter S2. The correction rule table made by this method is shown in FIG. 13E. Then, correction values for the diameter S1 obtained at the Step ST.2 or the diameter S2 are extracted from the correction rule table so made.

Next, at the Step ST.5, the extracted correction values are added to the contact hole as a bias amount. This bias processing can be automatically executed by making a correction tool adapted to the present invention through programming, storing it in CAD, for example, and using it appropriately. The cross section of the state where the bias processing is completed is shown in FIGS. 13F and 13G. As shown in FIG. 13F, the diameter S1 of the contact portion 15 is enlarged so that it is almost equal to the diameter S2 of the contact portion 16. Also, as shown in FIG. 13G, the diameter S2 of the contact portion 16 is reduced so that it is almost equal to the diameter S1 of the contact portion 15.

According to this six preferred embodiment, when the diameter S1 of the contact portion 15 in contact with the transistor portion is different from the diameter S2 of the contact portion 16 in contact with the gate, the diameter S1 can be made the same as the diameter S2, and the diameter S1 and the diameter S2 can be finished in the state close to the design value.

As the diameter S1 and the diameter S2 can be finished in the state closer to the design value, a problem such as a rise in contact resistance caused by reduction in a contact area or the like can be avoided. Thus, in a formed integrated circuit, a contact resistance closer to the design value can be obtained, and expected electric performance can be gained easily on circuits.

The difference between an example (FIG. 13B) and another example (FIG. 13C) of the correction rule is that the correction value is incremented by "W" with "S1-S2=0" as reference or that the correction value is incremented by "W" with "S1-S2=0" plus ½ of the design grid width W as reference. In either example, a pattern formed on the wafer can be finished in the state close to the design value or according to the design value.

However, another example that the correction value is incremented by "+W" with the value plus ½ of the design grid width as reference shown in FIG. 13C is finished much closer to the design value or according to the design value.

That is because in one example shown in FIG. 13B, the variation of "S1-S2" when "design dimension <c," can be kept to the variation within the range from "S1-S2=0 (that is, design value)" to "−W," while another example shown in FIG. 13C can further keep the variation to the range from "S1-S2=0" (that is, design value) to the range of "±W/2."

Also, as shown in FIG. 13F or FIG. 13G, in the pattern according to the above example, bias processing is made for the gate film thickness L, but when there is a film thickness other than the gate film thickness L, a correction rule can be made for each film thickness with the method as above, and a correction rule table is made according to this correction rule. After that, bias processing can be made for each line width based on the correction rule table so made.

Seventh Preferred Embodiment

Next, a mask pattern correcting method according to a seventh preferred embodiment of the present invention will be explained.

The seventh preferred embodiment is fringe processing at a line end for each via in contact with both ends of the line form above and below.

Figure 14:
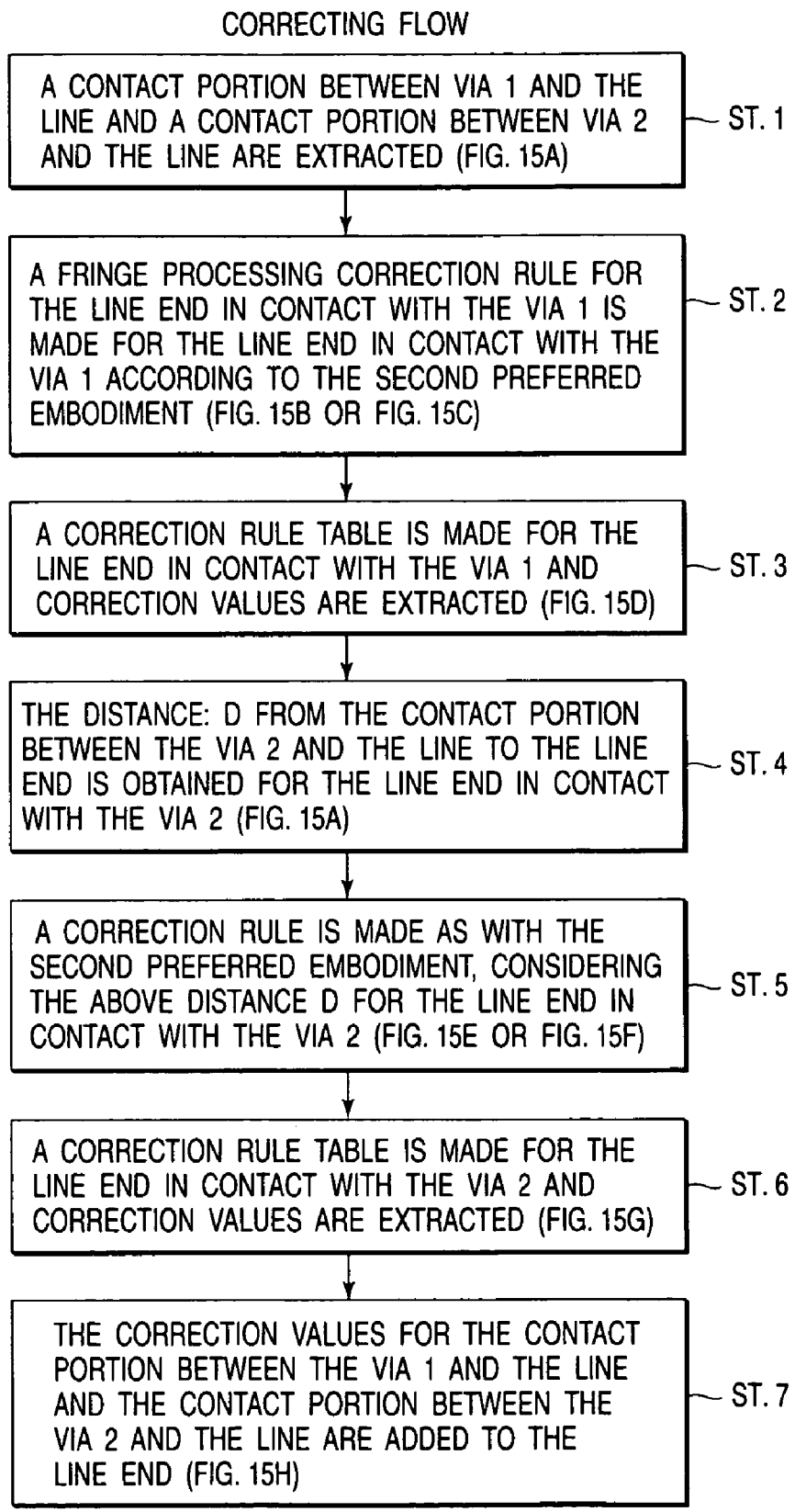
FIG. 14 is a flowchart showing a mask pattern correcting method according to a seventh preferred embodiment of the present invention.

FIG. 14 is a flowchart showing a mask pattern correcting method according to the seventh preferred embodiment, and FIGS. 15A to 15H are diagrams for explaining steps shown in FIG. 14.

Figure 15A:
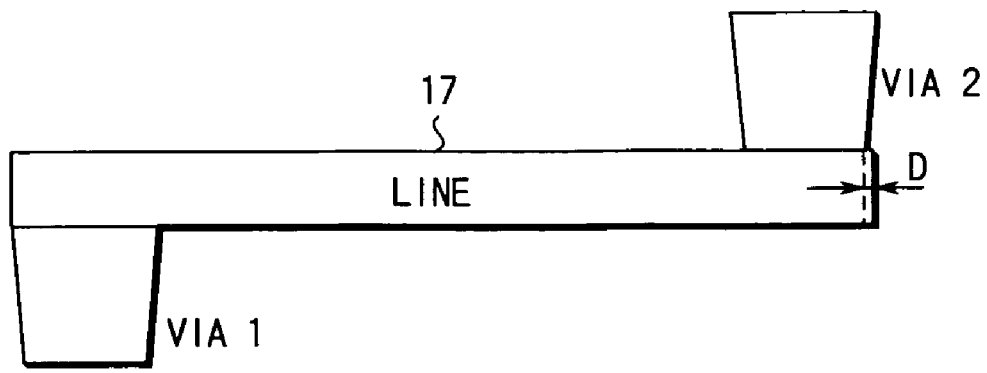
FIG. 15A is a sectional view showing a pattern example used for the seventh preferred embodiment of the present invention.

First, at the Step ST.1 shown in FIG. 14, a contact portion between a via 1 and a line portion 17 and a contact portion between a via 2 and a line portion 17 are extracted. FIG. 15A shows one example (cross section) of the pattern used for the seventh preferred embodiment.

Figure 15B:
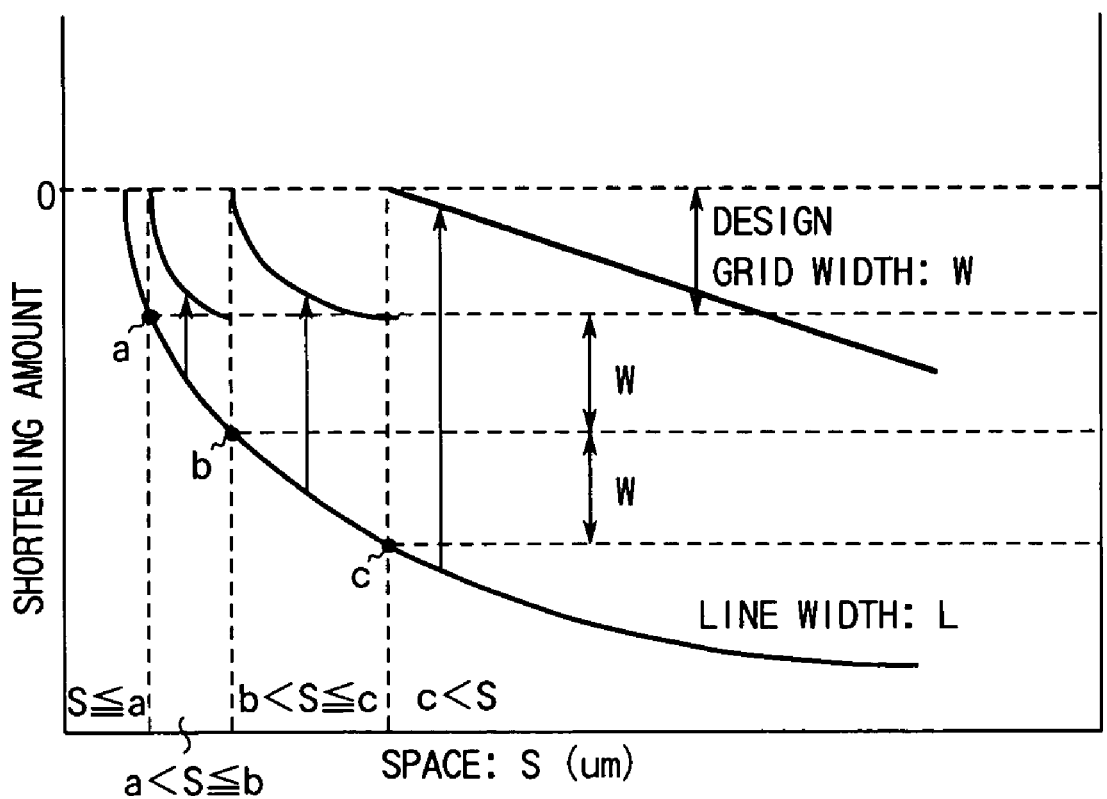
FIG. 15B is a diagram showing relationship between a shortening amount and a space width.
Figures 15C, 15D:
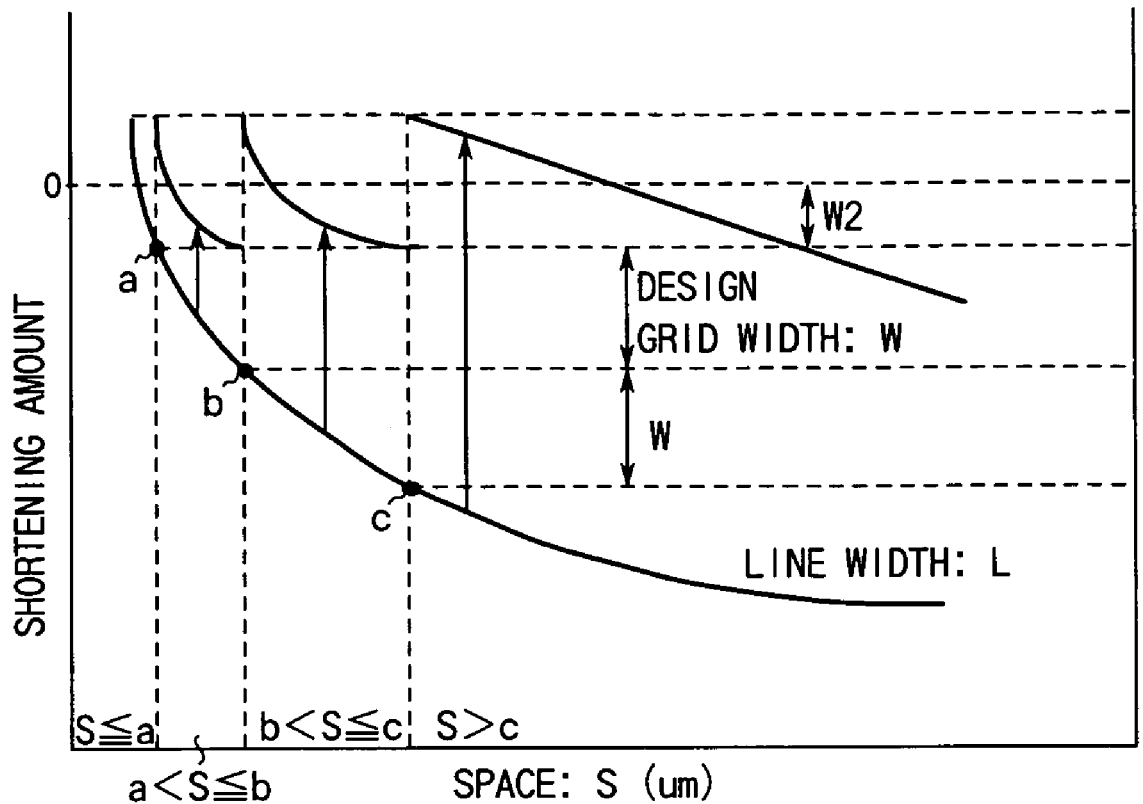
FIG. 15C is a diagram showing relationship between a shortening amount and a space width.
FIG. 15D is a table showing a correction rule.

Then, at the Step ST.2, using the method explained for the second preferred embodiment, fringe processing to the via 1 and the end of the line portion 17 in contact with this via 1 is made into a correction rule (FIG. 15B or 15C).

Then, at the Step ST.3, using the method explained for the second preferred embodiment, a correction rule table is made according to the above correction rule (FIG. 15D). After that, correction values are extracted from the correction rule table so made.

Next, at the Step ST.4, a distance D from the portion where the via 2 is in contact with the portion to the end of the line portion 17 is obtained experimentally or by simulation.

Figure 15E:
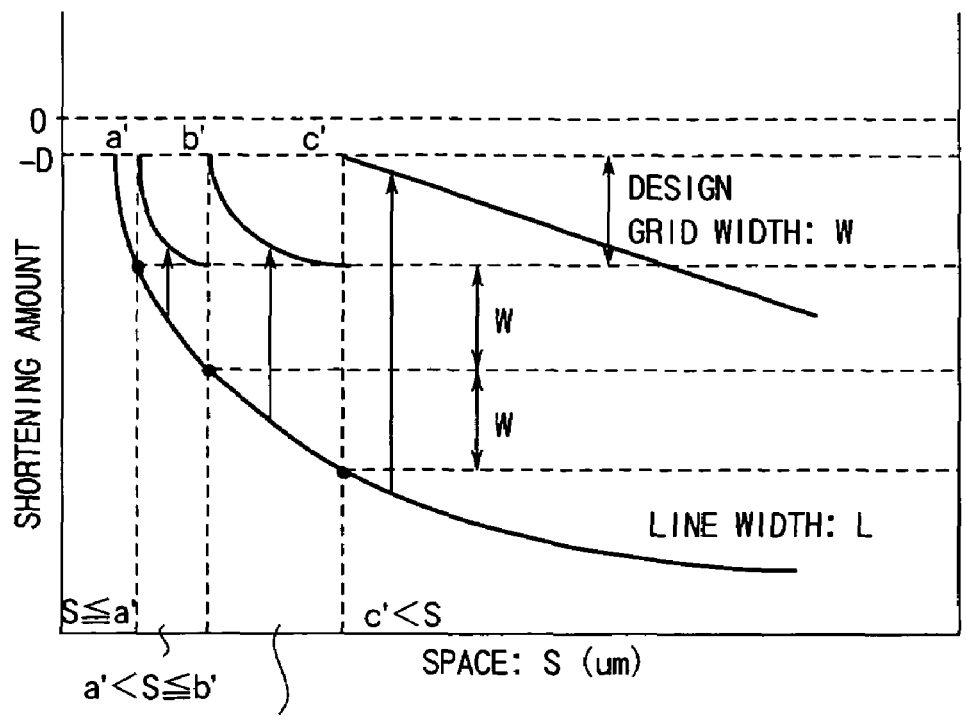
FIG. 15E is a diagram showing relationship between a shortening amount and a space width.
Figure 15F:
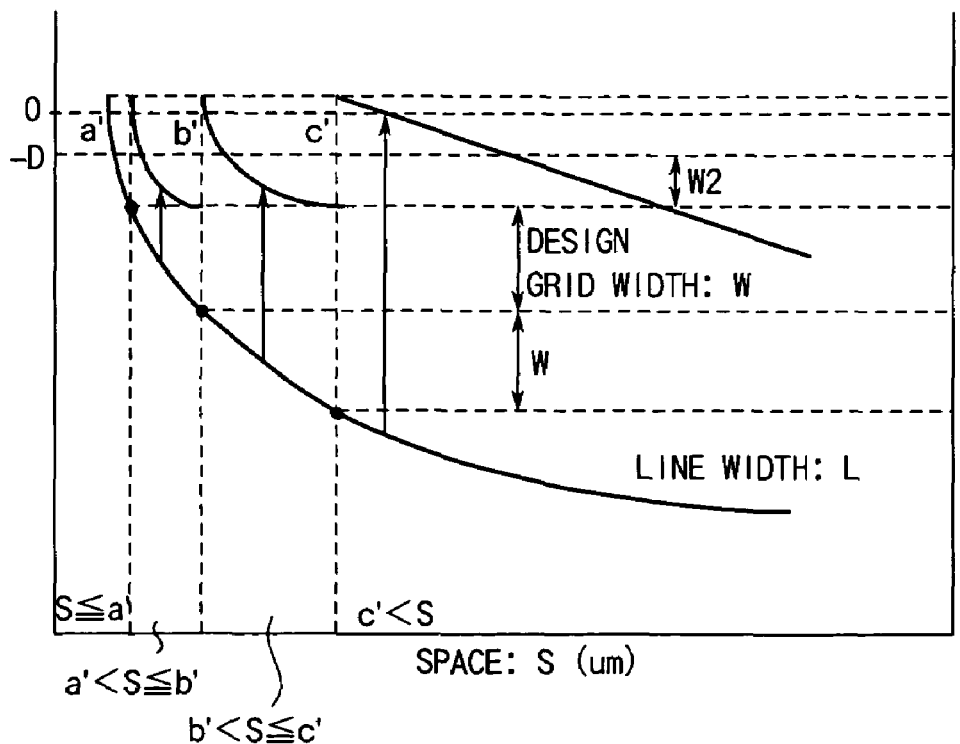
FIG. 15F is a diagram showing relationship between a shortening amount and a space width.

Then, at the Step ST.5, using the method explained for the second preferred embodiment, fringe processing to the end of the line portion 17 in contact with the via 2 is made into a correction rule (FIG. 15F or 15G).

Then, at the Step ST. 6, a correction rule table is made with the point of "shortening amount=−D" as reference (FIG. 15E) or with the point of "shortening amount=−D" plus ½ of the design grid width W as reference (FIG. 15F) (FIG. 15G). After that, correction values are extracted from the correction rule table so made.

Next, at the Step ST.7, the extracted correction values are added to the contact portion between the via 1 and the line portion 17 and the contact portion 19 between the via 2 and the line portion 17 as a fringe amount. This fringe processing can be automatically executed by making a correction tool adapted to the present invention through programming, storing it in CAD, for example, and using it appropriately. A pattern example of the state where the fringe processing is completed is shown in FIG. 15H. As shown in FIG. 15H, the contact portions 18 and 19 of the line portion 17 are provided with fringes 20-1 and 20-2, respectively.

According to this seventh preferred embodiment, fringe to correct shortening of the line portion 17 for the contact portions 18 and 19 of the line portion 17 is added, considering the environment surrounding the line portion 17 such as pattern density around the line portion 17, width of the line portion, thinning of the via, etc.

In a pattern made by the wafer process using a mask for manufacturing a semiconductor device on which such fringe processing is given, in comparison to the case where a mask is used to which a uniform fringe processing is given regardless of the surrounding environment, the above overlapped portion can be finished in the state closer to the design value or according to the design value.

In this way, as the above overlapped portion is finished in the state closer to the design value, a problem such as a rise in contact resistance caused by reduction in a contact area or the like can be avoided. Thus, in a formed integrated circuit, a contact resistance closer to the design value can be obtained, and expected electric performance can be gained easily on circuits.

Also, the difference between an example (FIG. 15B, FIG. 15E) and another example (FIG. 15C, FIG. 15F) of the correction rule is that the correction value is incremented by "W" with the shortening amount "0–D" as reference or that the correction value is incremented by "W" with the value of the shortening amount "0–D" plus ½ of the design grid width W as reference. In either example, a pattern formed on the wafer can be finished in the state close to the design value or according to the design value.

However, another example that the correction value is incremented by "+W" with the value plus ½ of the design grid width as reference shown in FIG. 15C is finished much closer to the design value or according to the design value.

That is because in one example shown in FIGS. 15B and 15E, when "S<c," the variation of the line width L can be kept to the variation within the range from the shortening amount "0–D" (that is, design value) to "–W," while another example shown in FIGS. 15C and 15F can further keep the variation to the range from the line width variation amount "0–D" (that is, design value) to the range of "±W/2."

Also, as shown in FIG. 15H, in the pattern according to the above example, correction to add the fringes 20-1 and 20-2 is made to the line portion 17 with the line width L, but when there is a line width other than the line width L, a correction rule is made with the same method as above for each line width, and a correction rule table is made according to this correction rule. After that, the correction to add fringes may be made for each line width based on the correction rule table so made.

Eighth Preferred Embodiment

Next, a mask pattern correcting method according to a eighth preferred embodiment of the present invention will be explained.

The eighth preferred embodiment is a correcting method, further considering misalignment in addition to the first to the fifth preferred embodiments and the seventh preferred embodiment.

FIG. 16 is a flowchart showing a mask pattern correcting method according to the eighth preferred embodiment.

First, at the Step 1 shown in FIG. 16, a correction rule table is made for each of the correcting methods by the first to the fifth preferred embodiments and the seventh preferred embodiment.

Then, at the Step ST.2, a misalignment amount is set at "+C." Then, the misalignment amount "+C" is added to fringe amount of each correction rule table and the corrected points. By this wora k, the correction rule table shown in FIG. 17A can be made from the first, second, third, and seventh preferred embodiments, the correction rule table shown in FIG. 17B from the fourth preferred embodiment, ad the correction rule table shown in FIG. 17C from the fifth preferred embodiment.

Next, as shown at the Step ST. 3, correction values are extracted from the rule table so made and the extracted correction values are added to the fringe amount.

According to this eighth preferred embodiment, correction values considering misalignment for the first to the fifth preferred embodiments and the seventh preferred embodiment are made into a correction rule. And according to this correction rule, correction processing is done automatically using the correction tool. By this correction processing, even in the case of dislocation of the desired dimension due to proximity effect and misalignment, corrected points can be finished according to the design value or close to the design value.

Ninth Preferred Embodiment

Next, a mask pattern correcting method according to a ninth preferred embodiment of the present invention will be explained.

The ninth preferred embodiment is correction of short-circuit of the narrow space width, considering the distance between the portion where the contact and the transistor portions overlap each other and the transistor portion end for the narrow space width of the transistor.

Figure 18:
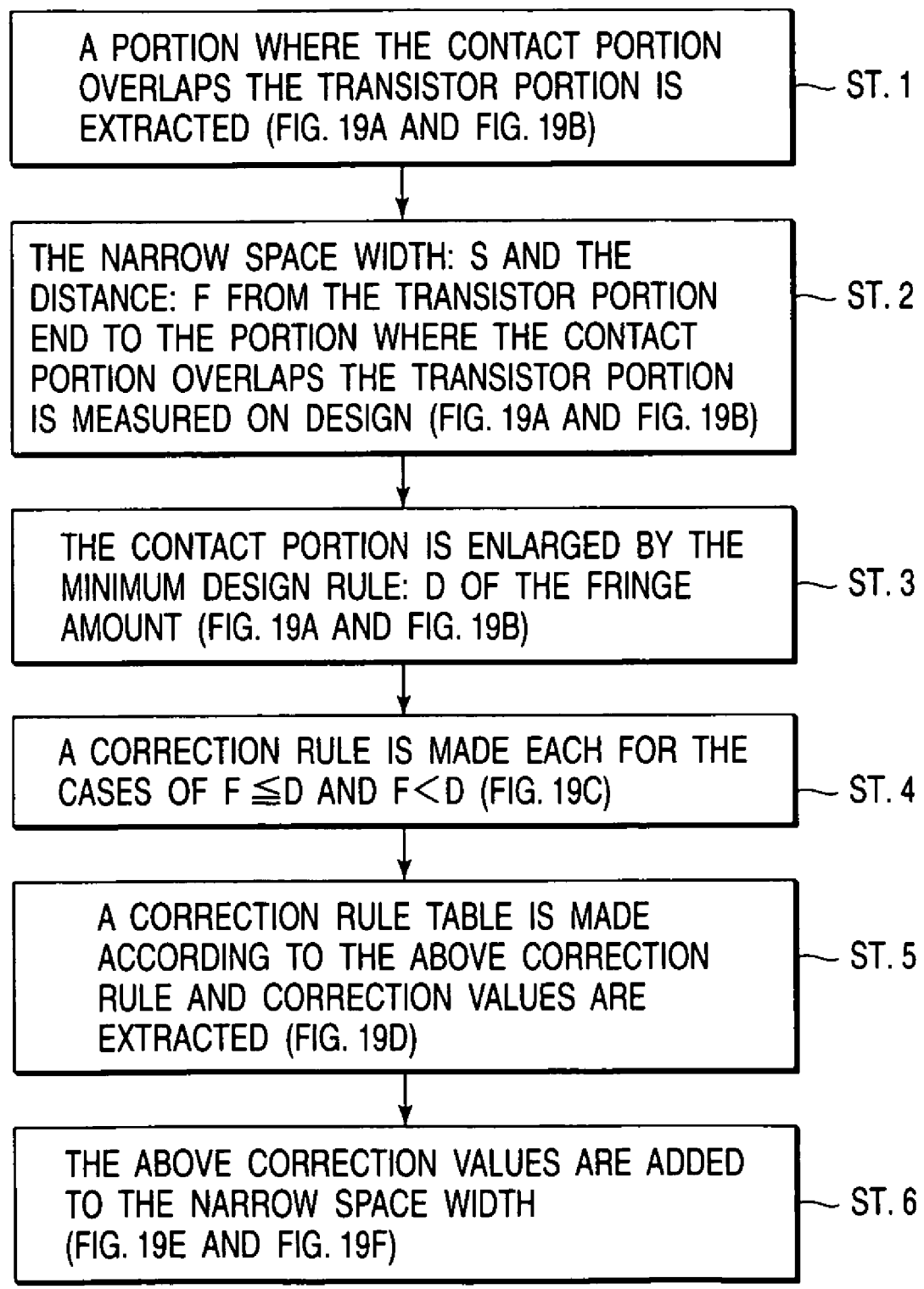
FIG. 18 is a flowchart showing a mask pattern correcting method according to a ninth preferred embodiment of the present invention.

FIG. 18 is a flowchart showing a mask pattern correcting method according to the ninth preferred embodiment. FIGS. 19A to 19F are diagrams for explaining steps shown in FIG. 18.

Figure 19A:
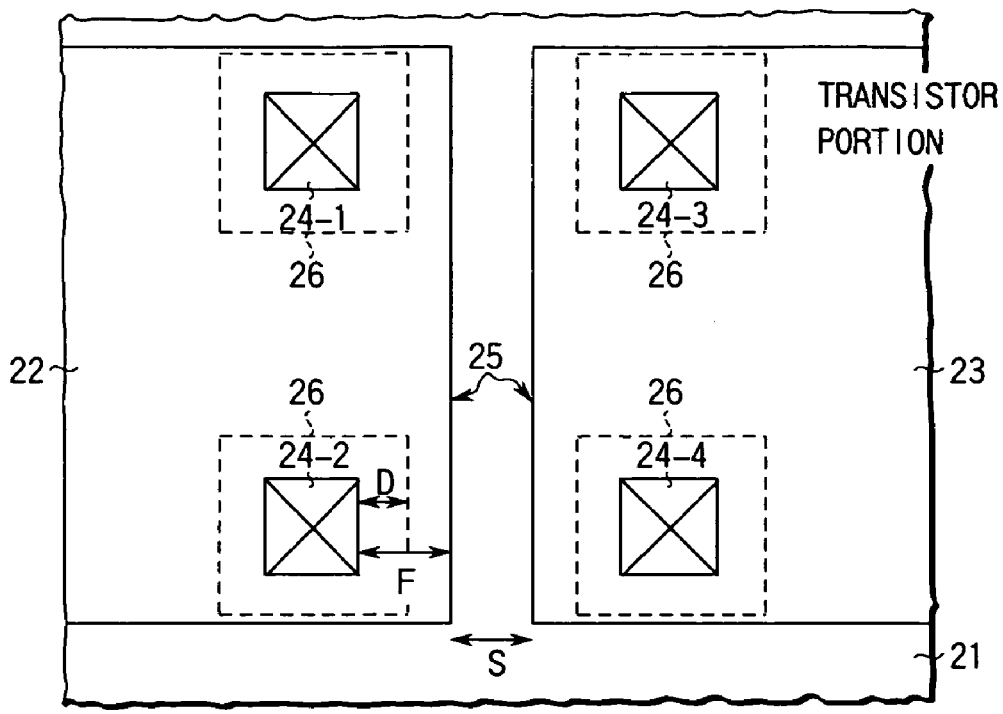
FIG. 19A is a plan view showing a pattern example used for the ninth preferred embodiment of the present invention.

At the Step ST.1 shown in FIG. 18, the portion where the contact portion overlaps the transistor portion is extracted. An example of the pattern used for the ninth preferred embodiment is shown in FIG. 19A and another pattern in FIG. 19B. The example shown in FIG. 19A and another example in FIG. 19B are on design, for example, on CAD data.

As shown in FIG. 19A, the pattern according to the example has transistor portions 22 and 23 separated from each other by a field portion (element separating portion) 21. The transistor portion 22 overlaps contact portions 24-1 and 24-2, while the transistor portion 23 overlaps contact portions 24-3 and 24-4, respectively.

Figure 19B:
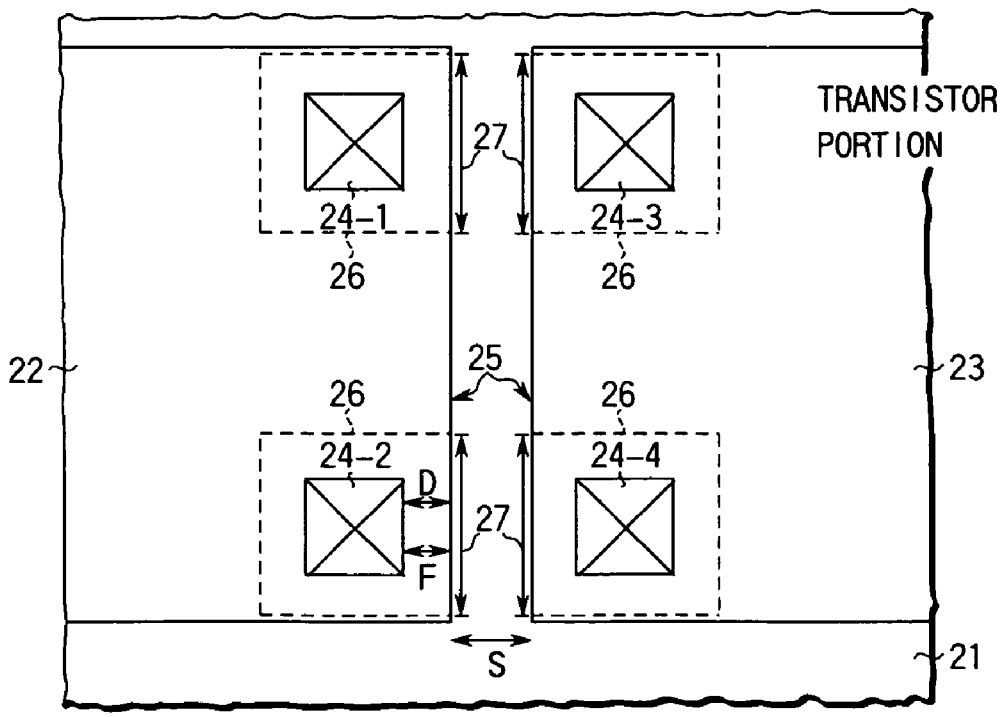
FIG. 19B is a plan view showing another pattern example used for the ninth preferred embodiment of the present invention.

The pattern according to another example shown in FIG. 19B is similar to the pattern according to the example, except the distance from the contact portions 24-2 through 24-2 to the transistor portion end 25.

Then, at the Step ST.2, a narrow space width S is measured on design. Next, the distance from the transistor portion end 25 to the contact portions 24-1 through 24-4 is measured on design. The minimum distance at this time is set as "F."

Then, as shown at the Step ST.3, the minimum bias amount and the minimum misalignment amount for the contact portions 24-1 through 24-4 are obtained experimentally or by simulation, and the sum of the bias amount and the misalignment amount at this time is set as "D." From this result, the contact portion is enlarged by the minimum design rule of the fringe amount. The enlarged contact portion is referred to by the reference number 26.

Figures 19C, 19D:
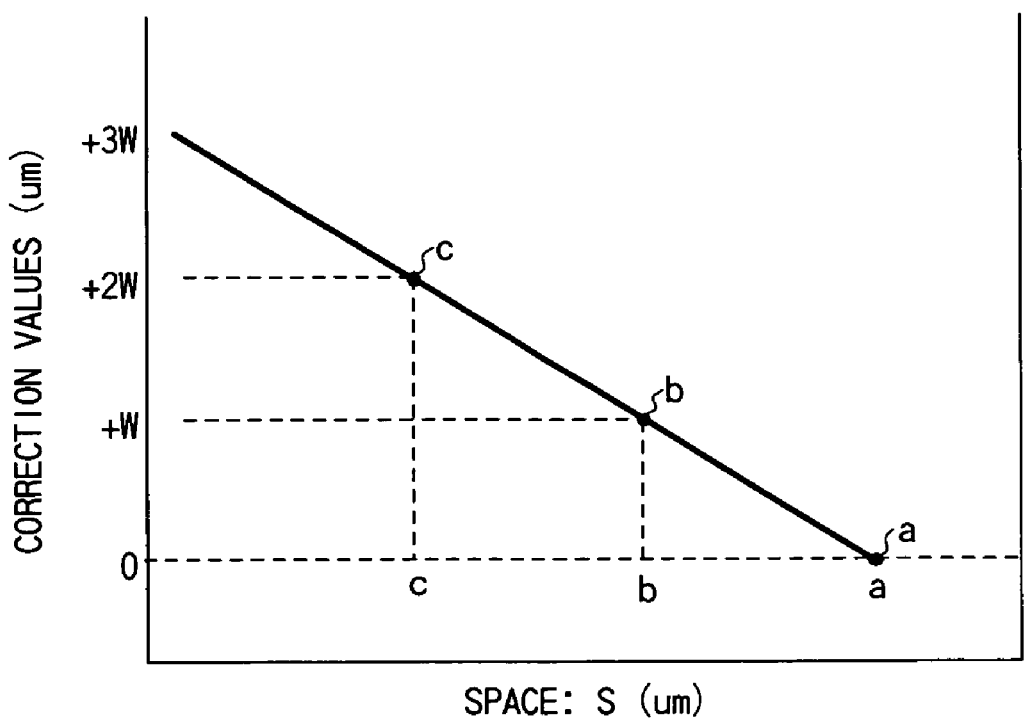
FIG. 19C is a diagram showing relationship between a correction amount and a space width.
FIG. 19D is a table showing a correction rule.
Figure 19E:
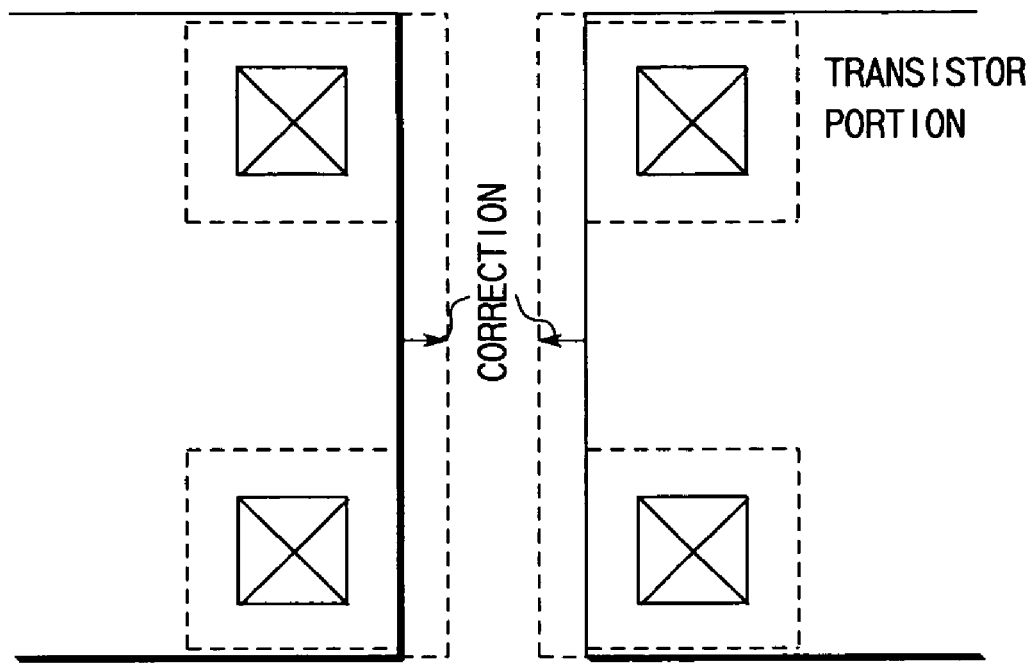
FIG. 19E is a plan view showing a pattern example used for the ninth preferred embodiment of the present invention.

Next, as shown at the Step ST.4, in the case of "D≦F" and "F<D," respectively, a correction value to enlarge the narrow space width by the size of the narrow space width S is obtained experimentally or by simulation, and a correction rule is established (FIG. 19C).

Then as shown at the Step ST.5, a correction rule table is made according to the above correction rule, and correction values are extracted (FIG. 19D). Here, when "F<D," the portion where the enlarged contact portion 26 is in contact with the transistor portion end 25 is extracted. This contact portion is referred to by the reference number 27 in FIG. 19B.

Figure 19F:
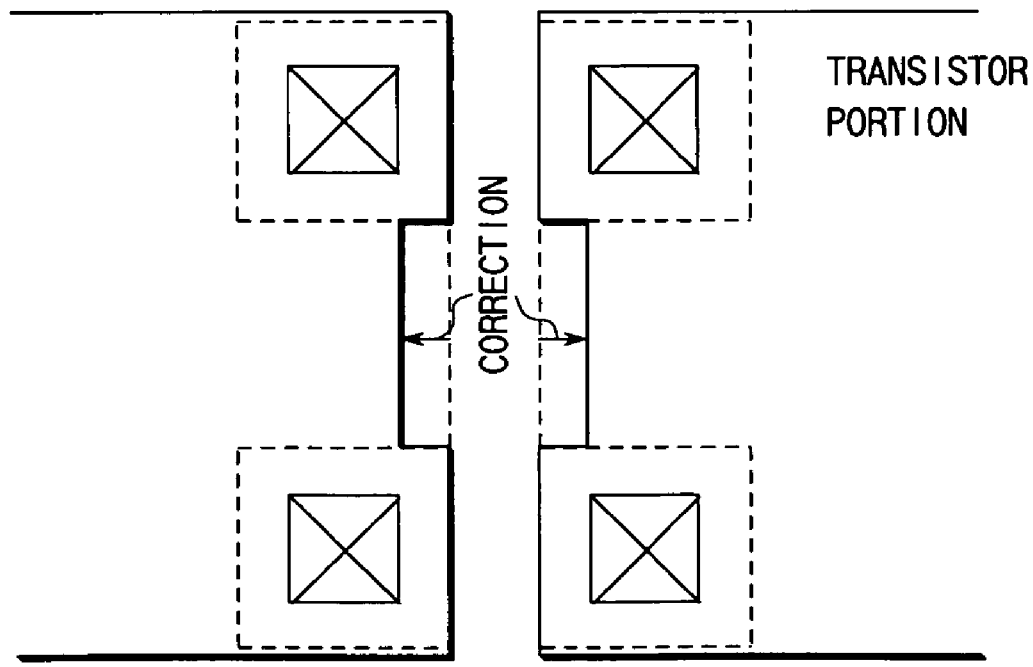
FIG. 19F is a plan view showing another pattern example used for the ninth preferred embodiment of the present invention.

Then, as shown at the Step ST.6, the extracted correction values are added to the narrow space width S. Here, when "D≦F," the entire narrow space width S is enlarged toward the transistor portions 22 and 23 as shown in FIG. 19F. Also, in the case of "F<D," as shown in FIG. 19F, the narrow space width S is enlarged toward the transistor portions 22 and 23 except the above portion 27 in contact.

According to this ninth preferred embodiment, by the sum of the bias amount and the misalignment amount of the contact portion, the minimum distance from the transistor portion end 25 to the contact portion, and the narrow space width S, the correction amount of the narrow space width portion is made into a correction rule table. Then, according to the correction rule table, narrow space width correction processing is made automatically using a correction tool. With such correction processing, short-circuit in the narrow space width can be prevented.

The prevent invention has been described above based on the first to the ninth preferred embodiments, but the present invention is not limited to the first to the ninth preferred embodiments and can be implemented with various variations without deviating from the subject matter of the invention.

For example, the mask pattern correcting method described in the preferred embodiment can be applied to CAD as a program which can be carried out by a computer by writing in a magnetic disk (floppy disk, hard disk, etc.), optical disk (CD-ROM, CD-RAM, DVD, etc.), semiconductor memory, etc. or can be applied to CAD by transmitting on a communication medium. Also, the CAD to implement the present invention carries out the above mask pattern correction processing by reading the program recorded in the recording medium and controlling operation by this program.

Also, the present invention can be applied to any semiconductor integrated circuit device but is especially effective for logic integrated circuit device with random pattern such as microprocessors as an example.

Also, the present invention can be implemented with various variations without deviating from the subject matter of the present invention.

As mentioned above, according to the present invention, a pattern correcting method of a mask for manufacturing a semiconductor device which can consider pattern relationship of finishing error and obtain sufficient correction accuracy.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A pattern correcting method of a mask for manufacturing a semiconductor device comprising:

extracting a correction portion to be corrected from a mask pattern on the mask, the correction portion being an overlapped portion where a line portion overlaps a contact portion;

obtaining a surrounding environment of the correction portion, the surrounding environment of the correction portion being a space width between the line portion and another line portion; and giving a variable correction amount to the correction portion in accordance with the surrounding environment, the variable correction amount being a line width given to the overlapped portion, wherein the line width is increased by (i) an integer multiple of a design grid width in accordance with the space width and (ii) a misalignment amount.

2. The pattern correcting method according to claim 1, wherein the line width is further increased by half the design grid width.

3. The pattern correcting method according to claim 2, wherein the line width is further increased by a misalignment amount.

4. A pattern correcting method of a mask for manufacturing a semiconductor device comprising:

extracting a correction portion to be corrected from a mask pattern on the mask, the correction portion being an overlapped portion where a line portion overlaps a contact portion;

obtaining a surrounding environment of the correction portion, the surrounding environment of the correction portion being a space width between the line portion and another line portion; and giving a variable correction amount to the correction portion in accordance with the surrounding environment, the variable correction amount being a line width given to the overlapped portion, wherein the line width is increased by (i) an integer multiple of a design grid width in accordance with the space width, (ii) a misalignment amount, and (iii) half the design grid width.

* * * * *